(12) United States Patent
Maru

(10) Patent No.: US 8,140,930 B1
(45) Date of Patent: Mar. 20, 2012

(54) ENCODER AND DECODER BY LDPC CODING

(75) Inventor: Tsuguo Maru, Tokyo (JP)

(73) Assignee: NEC Corporation, Tokyo (JP)

( * ) Notice: Subject to any disclaimer, the term of this patent is extended or adjusted under 35 U.S.C. 154(b) by 1052 days.

(21) Appl. No.: 11/914,328

(22) PCT Filed: Apr. 18, 2006

(86) PCT No.: PCT/JP2006/308116
§ 371 (c)(1),
(2), (4) Date: Nov. 13, 2007

(87) PCT Pub. No.: WO2006/120844
PCT Pub. Date: Nov. 16, 2006

(30) Foreign Application Priority Data

May 13, 2005 (JP) ................................. 2005-141588

(51) Int. Cl.
*H03M 13/00* (2006.01)
(52) U.S. Cl. .................... 714/752; 714/758; 714/804
(58) Field of Classification Search .................. 714/752, 714/800, 758, 790, 804, 801
See application file for complete search history.

(56) References Cited

U.S. PATENT DOCUMENTS

| | | | |
|---|---|---|---|
| 6,938,196 B2 * | 8/2005 | Richardson et al. | 714/752 |
| 7,103,819 B2 * | 9/2006 | Kikuchi et al. | 714/752 |
| 7,174,495 B2 * | 2/2007 | Boutillon et al. | 714/752 |
| 7,197,690 B2 * | 3/2007 | Shen et al. | 714/792 |
| 7,237,181 B2 * | 6/2007 | Richardson | 714/780 |
| 2003/0229843 A1 | 12/2003 | Yu et al. | |

FOREIGN PATENT DOCUMENTS

| | | |
|---|---|---|
| EP | 1482643 A | 12/2004 |
| EP | 1884023 B | 11/2009 |
| JP | 2003198383 | 7/2003 |
| JP | 2003244109 | 8/2003 |
| JP | 2004186940 | 7/2004 |
| JP | 2004266463 | 9/2004 |
| JP | 2005065271 | 3/2005 |
| KR | 2006057253 A | 5/2006 |
| WO | 2004049578 A | 6/2004 |

OTHER PUBLICATIONS

Tom Richardson, Multi-edge type LDPC codes, On the occasion of Bob McEliece's 60th birthday celebration, Feb. 3, 2003, http://www.systems.caltech.edu/~jeremy/research/other_papers) pp. 1 to 52 http://www.systems/caltech.edu/~jeremy/research/other_papers/McEliece_bday.pdf_1.pdf.

Tom Richardson & Rudiger Urbanke, Multi-Edge Type LDPC Codes, Apr. 20, 2004 pp. 1 to 36, http://ece.iisc.ernet.in/~vijay/multiedge.pdf.

(Continued)

*Primary Examiner* — Fritz Alphonse

(57) ABSTRACT

The present invention is intended to provide an LDPC coding scheme which is capable of efficiently implementing a high-performance and high-speed encoder and decoder of an error correcting code suitable for the field of communications such as mobile communications. As to the configuration, a Tanner graph for representing codes with variable nodes and check nodes is used to classify the individual nodes into a plurality of categories. For calculating a probability propagation in iterative decoding, weighting previously determined for each category is performed on a log-likelihood ratio (LLR) subjected to propagation.

21 Claims, 11 Drawing Sheets

OTHER PUBLICATIONS

Farhad Zarkeshvari & Amir H. Banihashemi, On Implementation of Min-Sum Algorithm for Decoding Low-Density Parity-Check (LDPC) Codes, Global Telecommunications Conference, 2002. GLOBECOM '02, vol. 2, Nov. 2002, pp. 1349 to 1353.

Thomas J. Richardson & Rudiger J. Urbanke, Efficient Encoding of Low-Density Parity-Check Codes, IEEE Transactions on Information Theory, vol. 47, No. 2, Feb. 2001, pp. 638 to 656.

Sae-Young Chung, Thomas J. Richardson, and Rudiger L. Urbanke, Analysis of Sum-Product Decoding of Low-Density Parity-Check Codes Using a Gaussian Approximation, IEEE Transactions on Information Theory, vol. 47, No. 2, Feb. 2001, pp. 657 to 670.

PCT/JP2006/308116 International Search Report mailed Jun. 20, 2006.

Korean Office Action issued Feb. 23, 2009 for KR Application No. 10-2007-7026683.

Supplementary European Search Report for EP 06 73 2045 dated Sep. 6, 2010.

J. Chen et al., "Improved Min-Sum Decoding Algorithms for Irregular LDPC Codes", IEEE International Symposium on Information Theory, XP010846293, Sep. 4, 2005.

J. Heo, "Analysis of scaling soft information on low density parity check code", Electronics Letters, vol. 39, No. 2, Jan. 23, 2003.

J. Chen et al., "Density Evolution for Two Improved BP-Based Decoding Algorithms of LDPC Codes", IEEE Communications Letters, vol. 6, No. 5, May 2002, pp. 208-210.

J. Heo, "Performance and Convergence Analysis of Improved Min-Sum Iterative Decoding Algorithm", IEICE Trans. Commun., vol. E87-B, No. 10, Oct. 1, 2004, pp, 2847-2858.

Ohhashi et al., "Performance Analysis of BP-based Algorithms for Irregular Low-Density Parity-Check Codes On Fast Rayleigh Fading Channel", IEEE 60th Vehicular Technology Conference, vol. 4, Sep. 26, 2004, pp. 2530-2534.

J. Zhang et al., "Improved Min-Sum Decoding of LDPC Codes Using 2-Dimensional Normalization", IEEE Global Telecommunications Conference, Globecom '05, vol. 3, Nov. 28, 2005, pp. 1187-1192.

Yen-Chin Liao et al., "A Dynamic Normalization Technique for Decoding LDPC Codes", IEEE Workshop on Signal Processing System Design and Implementation, SIPS 2005, 2005, pp. 768-772.

* cited by examiner

Fig. 3

TEST MATRIX $$H = \begin{array}{c} \\ 1 \\ 2 \\ 3 \\ 4 \\ 5 \\ 6 \\ 7 \\ 8 \\ 9 \\ 10 \\ 11 \end{array} \begin{bmatrix} \overbrace{\phantom{aaaaaaaaaaaaaaaaa}}^{\text{Type1}} & \overbrace{\phantom{a}}^{\text{Type2}} & \overbrace{\phantom{aaaa}}^{\text{Type3}} & \\ 1 & & & & & & & & 1 & 1 & 1 & & & & \\ 1 & 1 & & & & & & & & 1 & 1 & & & & \\ & 1 & 1 & & & & & & & 1 & 1 & & & & \\ & & 1 & 1 & & & & & & 1 & & 1 & & & \\ & & & 1 & 1 & & & & & 1 & & 1 & & & \\ & & & & 1 & 1 & & & & 1 & & 1 & & & \\ & & & & & 1 & 1 & & & 1 & & 1 & & & \\ & & & & & & 1 & 1 & & 1 & & 1 & & & \\ & & & & & & & & & 1 & 1 & 1 & 1 & & \\ & & & & & & & & & & 1 & 1 & 1 & 1 & \\ & & & & & & & & & & 1 & 1 & 1 & & 1 \end{bmatrix}$$

Fig. 4

| | | | Variable Node | | | | | | Check Node | | | | | |
|---|---|---|---|---|---|---|---|---|---|---|---|---|---|---|
| $\nu_{b,d}$ | b | | d | | | | | | $\mu_d$ | d | | | | |
| | $b_0$ | $b_1$ | $d_1$ | $d_2$ | $d_3$ | $d_4$ | $d_5$ | | | $d_1$ | $d_2$ | $d_3$ | $d_4$ | $d_5$ |
| 0 ~ 10239 | 0 | 1 | 2 | 0 | 0 | 0 | 0 | | 0 ~ 10239 | 2 | 1 | 1 | 0 | 0 |
| 10240~ 11519 | 0 | 1 | 0 | 8 | 0 | 0 | 0 | 0.8 | | | | | | |
| 11520~ 11519 | 1 | 0 | 0 | 0 | 3 | 3 | 0 | | 10240~ 14079 | 0 | 0 | 0 | 3 | 1 |
| | 1 | 0 | 0 | 0 | 2 | 3 | 0 | 0.3 | | | | | | |
| 15360~ 19199 | 0 | 1 | 0 | 0 | 0 | 0 | 1 | | | | | | | |
| erasure | $\sigma^2$ | | Type1 | Type2 | Type3 | Type4 | Type5 | | | Type1 | Type2 | Type3 | Type4 | Type5 |

ENCODER AND DECODER BY LDPC CODING

TECHNICAL FIELD

The present invention relates to a decoder and an encoder of an LDPC (Low-Density Parity-Check) coding scheme which is an error correction coding scheme.

BACKGROUND ART

The LDPC coding scheme was proposed by Gallager in 1962. The LDPC code refers to a linear code which has a test matrix, the elements of which are largely "0." In a classical coding theory, a test matrix was determined to design a code. A similar definition can also be made for the LDPC coding scheme which originates from a turbo principle which is said to introduce a new era of coding theory. The present invention, however, employs a definition which is made based on a Tanner graph which more grasps the essence.

The Tanner graph is a two-part graph in which a code is represented by two types of nodes called a variable node and a check node, where a branch connected to each node is called an "edge," and the number of branches connected to each node is called the "order of the node." The total number of branches is equal to the number of "1's" which are set in a test matrix. The number of "1's" in the column direction of the test matrix is called a "column weight," and the number of "1's" in the row direction is called a "row weight." In the LDPC coding scheme, this test matrix is not unique. Decoding of the LDPC coding scheme depends on the test matrix, and is performed by calculating a probability propagation by a method called "iterative decoding."

In recent years, a method which has further developed the LDPC code having powerful error correcting capabilities which are said to come closer to the Shannon limit, involves finding an order distribution using DE (abbreviation of Density Evolution) which is an approach for calculating, for each of the repetitions, a change in the probability density function of LLR for an ensemble of the same code as LDPC which has a certain order distribution by a method based on a randomly configured code and repeated probabilistic decoding, and expanding this approach for a singular LDPC code to search an excellent order distribution in a probability propagation calculation performed for a log-likelihood ratio (LLR) subjected to propagation based on a local structure of the code possessed by the graph in a probability propagation calculation between respective nodes on a Tanner graph. In this regard, a code determined by a regular graph which is equal in the order of nodes is called a "regular LDPC code," while one which is not equal in the order is called a "code same as singular LDPC."

The probability propagation calculation on the Tanner graph is typically a message transmission type algorithm called "sum-product," however, if one attempts to faithfully execute this, an increase in circuit scale will arise. Therefore, a daring approximation is made in a Min (Max) Log region. In this regard, an approximation in the MaxLog region is also called "minSum algorithm" in the LDPC coding.

As described above, it is necessary to use a singular LDPC code which accords with the order distribution based on DE in order to accomplish powerful error correcting capabilities close to the Shannon limit. However, DE originally shows a iterative decoding characteristic limit for the case where the code length is virtually infinite, and actually requires memories for storing an immense code length of approximately at least $10^6$-$10^7$ bits, by way of example, and also requires a high maximum order of approximately 100-200 for a weighting distribution. Here, a higher order means that the circuit size is correspondingly larger.

In recent years, studies have aggressively progressed in the field of communications, such as mobile communications, and higher performance, higher speed, and higher efficiency have been strongly required for an encoder and a decoder of an error correcting code. However, there is a problem that even if high performance close to the Shannon limit can be accomplished, this is not realistic for mobile bodies.

Recently, to cope with the problem, an attempt has been made to reduce a high weighting distribution of the singular LDPC code, where a method is employed for classifying nodes into categories to account for an error floor which is likely to occur at a low weighting distribution. In this regard, these categories also include a category which has a node of weight "1," and a category which punctures a variable node.

Also, a daring approximation in the Min (Max) Log region is employed instead of sum-product for a feasible circuit scale, but a problem arises in that the approximation gives rise to a non-negligible degradation in characteristics.

Further, even if an opposing encoder employs a sparse test matrix by using a low weighting distribution for its generation matrix, it is however almost certain that this is not a sparse matrix. Being sparse means having a low complexity. Accordingly, a calculation method for generating a code while making use of a sparse test matrix is disclosed in "Efficient encoding of low-density parity-check codes," IEEE Transactions on information theory, Volume 47, Issue 2, pp. 638-656.

Patent Document 1 (JP-2005-65271A) discloses an algorithm called "Max-Log-MAP" which is used in decoding in a turbo coding scheme. The LDPC coding scheme is a scheme different from the turbo coding scheme, and completely differs in its coding structure. Nevertheless, they are similar in that iterative decoding is performed.

In regard to weighting in the MaxLog approximation in the iterative decoding processing, it seems that in Patent Document 1 two types of weighting (Wc, Wa) are performed, but one of the two types of weighting (Wc) is performed only for an information series ($\Lambda c(xt,0)$) in a received signal, and this information series ($\Lambda c(xt,0)$) takes the same value during iterative decoding processing. In other words, this is not relevant to LLR which is subjected to probability propagation in iterative decoding processing. Essentially, weighting for a received signal should be determined in consideration of not only an information series and a parity series but also signal point mapping in modulation/demodulation, and should be thought separately from LLR which is subjected to the probability propagation in iterative decoding processing. Summarized in this way, it is understood that LLR subjected to probability propagation in this example is one of the extrinsic log-likelihood ratios (extrinxic LLR, hereinafter abbreviated as "extrinsic LLR"). Weighting processing performed on this extrinsic LLR in Max-Log-MAP in the turbo code is already a known fact, and Patent Document 2 (Japanese Patent No. 3246484), for example, discloses in FIG. 1 an example in which a weighting of 0.75 times is performed on extrinsic LLR through a shift sum and is realized with a low complexity.

Patent Document 1 discloses in FIG. 5 an example in which weighting processing is performed for extrinsic LLR for each half iteration.

In other words, the iterative decoding of the turbo coding scheme, including the technology disclosed in Patent Document 1, is basically controlled for a single probability propagation subject called the extrinsic log-likelihood ratio (extrinxic LLR).

Patent Document 3 (JP-2004-266463A) in turn discloses a generating method which performs a density evolution method (Density Evolution) which is a method for analysis in the LDPC coding scheme through a Gaussian approximation method (Gaussian Approximation; hereinafter abbreviated as "GA") which is also a method, and uses a Latin square.

Specifically, a method used in Patent Document 3 is an approach which can perform a trace analysis for a probability distribution only with a mean value, and ends up to simultaneously tracing the variance in probability propagation processing which preserves the relation called "Symmetry condition."

Non-Patent Document 1: "Efficient encoding of low-density parity-check codes," IEEE Transactions on information theory, Volume 47, Issue 2, pp. 638-656
Patent Document 1: JP-2005-65271A
Patent Document 2: Japanese Patent No. 3246484
Patent Document 3: JP-2004-266463A

DISCLOSURE OF THE INVENTION

Problem to be Solved by the Invention

To provide powerful error correcting capabilities close to the Shannon limit, it is necessary to use a singular LDPC code in accordance with an order distribution based on DE, but a problem arises in that a memory is required to store an immense code length, and the circuit scale increases. Also, there is a problem that even if high performance close to the Shannon limit can be realized, this is not realistic for mobile bodies.

Although an attempt has been made to reduce a high weighting distribution of the singular LDPC code, a problem arises in that this gives rise to a non-negligible degradation in characteristics.

While a sparse matrix is desired for an encoder, even if generating a matrix employs a sparse test matrix having a low weighting distribution, it is almost certain, however, that this is not a sparse matrix. While Non-Patent Document 1 discloses a calculation method for generating a code while making use of a sparse test matrix, it simply discloses a calculation method for creating a program, and does not at all refer to an architecture which enables a high-speed operation.

The present invention has been made in view of the problems inherent to the prior art as described above, and it is an object of the invention to provide a decoder and an encoder which employ an LDPC coding scheme that has powerful error correcting capabilities close to the Shannon limit in a circuit scale which can be mounted in a mobile body used in the field of communications such as mobile communications.

Further, it is another object of the invention to provide a method which demonstrates high performance even when an approximation calculation such as MaxLog approximation (called the "minSum algorithm" as well) or the like is used for a probability propagation calculation for reducing the circuit scale when respective nodes are classified into categories in realizing the foregoing.

It is a further object of the present invention to provide an architecture for an LDPC decoder which accomplishes high performance and higher speeds.

It is a further object of the present invention to provide a configuration for accomplishing a reduction in circuit scale and higher speeds even in an LDPC encoder which is the reverse of an LDPC decoder.

Means for Solving the Problem

An LDPC decoder of the present invention uses a Tanner graph in an LDPC coding scheme, wherein each node is can be classified into a plurality of categories, and is configured to be characterized by performing weighting previously determined for each of the categories for a log-likelihood ratio (hereinafter abbreviated as "LLR") subjected to a propagation in a probability propagation calculation in iterative decoding.

In this event, the probability propagation calculation in the iterative decoding may be a MaxLog approximation (or a minSum algorithm) and may determine a weighting value in accordance with the column weight of the test matrix belonging to each category.

The LDPC decoder may have a category of an RA structure (which is an abbreviation of Repeat Accumulate structure and is also called a "zig-zag structure") within the plurality of categories as the Tanner graph, wherein weighting of this category may be larger than weighting of other categories.

An LDPC decoder according to another aspect of the present invention uses a Tanner graph in an LDPC coding scheme, wherein each node forming part of a graph is can be classified into a plurality of groups according to the column weight of the test matrix thereof, and is configured to be characterized by performing weighting determined for each of the groups on a log-likelihood ratio (hereinafter abbreviated as "LLR") subjected to propagation in a probability propagation calculation in iterative decoding.

An LDPC decoder according to another aspect of the present invention uses a Tanner graph in an LDPC coding scheme, wherein each node can be classified into a plurality of categories, and is characterized by changing the number of divided memory banks for storing a log-likelihood ratio (LLR) subjected to propagation in accordance with a weight distribution of a test matrix belonging to each category to enable parallel access to the log-likelihood ratio.

In this event, the LDPC decoder uses a Tanner graph in an LDPC coding scheme, wherein each node can be classified into a plurality of categories, and may have a structure for changing the number of divided memory banks for storing a log-likelihood ratio (LLR) subjected to propagation in accordance with the weight distribution of a test matrix belonging to each category, and may perform parallel access to the log-likelihood ratio function through a caching circuit having a FIFO function.

The LDPC decoder may also have a second minimum value detector circuit for detecting a first minimum value by using a first minimum value detector circuit, masking an input corresponding to the detected first minimum value, and detecting a second minimum value when the probability propagation calculation in iterative decoding is performed by the MaxLog approximation (also called the "minSum algorithm"), wherein the first and second minimum value detector circuits may be configured by a pipeline structure, thereby equivalently executing an approximation calculation in one clock.

Also, the LDPC decoder may have a first memory for temporarily storing LLRs for variable nodes when the probability propagation calculation in iterative decoding is performed by the MaxLog approximation (also called the "minSum algorithm"), and a second memory for check nodes for preserving the first minimum value and the second minimum value according to claim 7, and a polarity signal which is caused by modulo-2 addition of inputs thereof, wherein inputs to the first memory may be sequentially performed by adding to a preserved value of the first memory based on a connection determined by the Tanner graph based on the first minimum value and the second minimum value according to claim 7, the first memory may be classified into categories according to claim 2, the weighting previously determined for each category may be performed for the first memory output. The decoder may perform iterative decoding which may include adding the weighted LLR and a received value LLR, thereafter subtracting a value selected by connection information determined by the Tanner graph based on the first minimum value and the second minimum value as well as the polarity signal which is caused by modulo-2 addition, which are the second memory accumulation result, and again may perform the MaxLog approximation (also called the "minSum algorithm").

Also, the weighting for each category may be performed on the first memory input or on a path returning to a MaxLog approximation (also called the "minSum algorithm") output, rather than on the first memory output.

Also, the connection information determined by the Tanner graph may preserve the positions of in the test matrix in the form of index.

Also, the LDPC decoder may have two planes of first memory for temporarily preserving LLRs for the variable nodes, and two planes of second memory for check nodes for preserving the first minimum value and the second minimum value, and a polarity signal which is caused by modulo-2 addition of inputs thereof, wherein when one of the memories is used as an output, the other memory is used as an input, and the input and output of the memories may be alternately switched from one repeated cycle to another in iterative decoding processing.

An LDPC encoder of the present invention is configured to be characterized by having means 1 for producing matrixes A, B, T having a relationship of an upper triangular zero matrix represented by:

$$H = \begin{bmatrix} A & B & T \\ C & D & E \end{bmatrix} \quad \text{[Equation 1]}$$

including a lower triangular matrix T having 1's at diagonal elements by a matrix manipulation of a test matrix H, further having means 2 for producing matrix F represented by:

$$F = (-E \cdot T^{-1} \cdot B + D)^{-1} \cdot (E \cdot T^{-1} \cdot A - C) \quad \text{[Equation 2]}$$

from the upper triangular zero matrix, wherein the means 1 and 2 are previously calculated offline processes, and have a memory 1 for accumulating the positions of elements 1's in resulting matrix F in the form of index, a memory 2 for storing information bit series S, and a first row counter, having a first circuit for producing first parity series p1 by taking an exclusive OR of the output of memory 2 further addressed by an index output by memory 1 addressed by the first row counter, having memory 3 for storing a series represented by:

$$-A \cdot s^T - B \cdot p_1^T \quad \text{[Equation 3]}$$

by taking a product of parity series p1 and matrix B resulting from the offline process, taking a product of information bit series S and the matrix A resulting from the offline process, and taking an exclusive OR of the products, having memory 4 for accumulating the positions of elements 1 of matrix T resulting from the offline process in the form of indexes, a memory 5 for storing second parity series p2, and a second row counter, and having a second circuit for taking an exclusive OR of the output of the memory 5 sequentially read and addressed further by the index output by memory 4 addressed by the second row counter, and the output of the memory 3 addressed by the second row counter to produce second parity series p2, and writing memory 4 written and addressed by the second row counter, wherein encoding processing is performed by the offline process and an online process by the second and second circuits.

In this event, memory 5 for storing second parity series p2 may comprise a number of mirror memories equal to the number of row weights of matrix T, memory 4 for storing the positions of 1's of elements of matrix T as indexes may be formatted to output a number of indexes equal to the number of row weights to a unit address, and these indexes may be read and addressed to each mirror memory to perform exclusive OR for the row weights at one time.

An LDPC decoder according to another aspect of the present invention uses a Tanner graph which represents a code with a variable node and a check node, and is characterized by comprising:

a first variable node memory including a plurality of memory banks for storing a log-likelihood ratio subjected to propagation classified into a plurality of categories on a category-by-category basis;

a second variable node memory including a plurality of memory banks for storing a weighting value for each of the plurality of categories on a category-by-category basis;

a weighting processing unit for determining a weighting value for each category stored in the second logarithmic node memory in accordance with the log-likelihood ratio subjected to propagation; and check node processing means for performing a probability propagation calculation in iterative decoding from the stored contents of each category in the first variable node memory and in the second variable node memory to output to the first variable node memory and to the weighting processing unit, as the log-likelihood ratio subjected to propagation.

In this event, the probability propagation calculation in iterative decoding in the check node processing unit may be performed by a MaxLog approximation or a minSum algorithm, and a weighting value may be determined in accordance with column weights of a test matrix belonging to each category.

The LDPC decoder may also have a category that includes RA structure within the plurality of categories, where weighting for this category may be larger than weighting for other categories.

An LDPC decoder according to another aspect of the present invention is an LDPC decoder using a Tanner graph which represents a code with a variable node and a check node, and is characterized by comprising:

a first variable node memory including a plurality of memory banks for storing a log-likelihood ratio subjected to a propagation classified into a plurality of groups in accordance with column weights of a test matrix on a category-by-category basis;

a second variable node memory including a plurality of memory banks for storing a weighting value for each of the plurality of groups on a group-by-group basis;

a weighting processing unit for determining a weighting value for each group stored in the second logarithmic node memory in accordance with the log-likelihood ratio subjected to propagation; and check node processing means for performing a probability propagation calculation in iterative decoding from stored contents of each category in the first variable node memory and in the second variable node memory to output to the first variable node memory and to the weighting processing unit as the log-likelihood ratio subjected to the propagation.

An LDPC decoder according to another aspect of the present invention is an LDPC decoder using a Tanner graph which represents a code with a variable node and a check node, and is characterized by comprising:

a first variable node memory including a plurality of memory banks for storing a log-likelihood ratio subjected to a propagation classified into a plurality of categories on a category-by-category basis;

a second variable node memory including a plurality of memory banks for storing a weighting value for each of the plurality of categories on a category-by-category basis;

a weighting processing unit for determining a weighting value for each category stored in the second logarithmic node memory in accordance with the log-likelihood ratio subjected to propagation; and check node processing means for performing a probability propagation calculation in iterative decoding from stored contents of each category in the first variable node memory and in the second variable node memory to output to the first variable node memory and to the weighting processing unit as the log-likelihood ratio subjected to the propagation, wherein the number of the memory banks in the first variable node memory is changeable in accordance with the weight distribution of a test matrix belonging to each category, thereby enabling parallel access to the first variable node memory.

In this event, the LDPC decoder may comprise a caching memory circuit having a FIFO function for performing parallel access to the first variable node memory.

Also, the check node processing means may include:

a first minimum value circuit for detecting a first minimum value by using a first minimum value detector circuit; and a second minimum value detector circuit for masking an input corresponding to the first minimum value detected by the first minimum value circuit, and detecting a second minimum value, wherein the first and second minimum value circuits may be configured in a pipeline structure, and may execute an approximation calculation equivalently in one clock.

Also, the check node processing means may include:

a first memory for temporarily preserving a log-likelihood ratio output to the first variable node memory classified into a plurality of categories and output to the weighting processing unit; and a second memory for check nodes for preserving the first minimum value and second minimum value, and a polarity signal which is caused by modulo-2 addition of inputs thereof;

may sequentially add an input to the first memory, to a preserved value in the first memory based on a connection determined by the Tanner graph based on the first minimum value and second minimum value; and may perform weighting previously determined for each category for the first memory output, and performs iterative decoding including adding the weighted LLR and a received value LLR, thereafter subtracting a value selected by connection information determined by the Tanner graph based on the first minimum value and the second minimum value as well as the polarity signal which is caused by modulo-2 addition, which are the second memory accumulation result, and again performs the MaxLog approximation or the "minSum algorithm."

Also, the check node processing means may include:

a first memory for temporarily preserving a log-likelihood ratio output to the first variable node memory classified into the plurality of categories and output to the weighting processing unit; and a second memory for check nodes for preserving the first minimum value and second minimum value, and a polarity signal which is caused by modulo-2 addition of inputs thereof;

may sequentially add an input to the first memory to a preserved value in the first memory based on a connection determined by the Tanner graph based on the first minimum value and second minimum value; and may perform weighting previously determined for each category for the first memory input or for a path returned to a MaxLog approximation or for minSum algorithm output, and performs iterative decoding including adding the weighted LLR and a received value LLR, thereafter subtracting a value selected by connection information determined by the Tanner graph based on the first minimum value and the second minimum value as well as the polarity signal which is caused by modulo-2 addition, which are the second memory accumulation result, and again performs the MaxLog approximation or the "minSum algorithm."

In this event, the connection information determined by the Tanner graph may preserve the positions of 1's in the test matrix in the form of an index.

Also, the first variable node memory and the second variable node memory, and the first memory and second memory may be such that when either one is used as an output, the other one is used as an input, and the input and output are alternately switched from one repeated cycle to another in iterative decoding.

An LDPC encoder according to another aspect of the present invention is characterized by comprising:

first means for producing matrixes A, B, T having the relationship of an upper triangular zero matrix represented by:

$$H = \begin{bmatrix} A & B & T \\ C & D & E \end{bmatrix} \quad \text{[Equation 4]}$$

including a lower triangular matrix T having 1's at diagonal elements by a matrix manipulation of test matrix H by a previously calculated offline process;

second means for producing matrix F represented by:

$$F = (-E \cdot T^{-1} \cdot B + D)^{-1} \cdot (E \cdot T^{-1} \cdot A - C) \quad \text{[Equation 5]}$$

from the upper triangular zero matrix by a previously calculated offline process;

a first memory for accumulating the position of a first element in matrix F produced by the first means and second means in the form of an index;

a second memory for storing information bit series S;

a first row counter;

a first circuit for producing first parity series p1 by taking an exclusive OR of the output of the second memory addressed by an index output by the first memory addressed by the first row counter;

a third memory for storing a series represented by:

$$-A \cdot s^T - B \cdot p_1^T \quad \text{[Equation 6]}$$

by taking a product of first parity series p1 and matrix B produced by the offline process, taking a product of information bit series S and matrix A produced by the offline process, and taking an exclusive OR of the products;

a fourth memory for accumulating the position of the first element of matrix T in the form of an index;

a fifth memory for storing second parity series p2;

a second row counter; and a second circuit for taking an exclusive OR of the output of the fifth memory sequentially read and addressed by an index output by the fourth memory addressed by the second row counter, and the output of the third memory addressed by the second row counter to produce second parity series p2, and writing the fifth memory written and addressed by the second row counter, wherein encoding processing is performed by the offline process and by an online process using the first and second circuits.

In this event, the fifth memory for storing second parity series p2 may comprise a number of mirror memories equal to the number of row weights of matrix T, and the fourth memory for storing the positions of 1's of elements of matrix T as indexes may be formatted to output a number of indexes equal to the number of row weights to a unit address, and these indexes are read and addressed to each mirror memory to perform exclusive OR for the row weights at one time.

The LDPC decoder of the present invention can correct the probability distribution of LLRs that are different from one category to another for deviations to improve performance because each node can be classified into a plurality of categories in the Tanner graph, and the weighting previously determined for each of the categories can be performed on a log-likelihood ratio (hereinafter abbreviated as "LLR") subjected to a propagation in a probability propagation calculation in iterative decoding processing.

Further, since the probability propagation calculation in iterative decoding can be a MaxLog approximation (or a minSum algorithm) and can determine a weighting value in accordance with the column weight of a test matrix belonging to each category, the LDPC decoder of the present invention can correct LLRs for deviations in accordance with the difference in column weights, which is the cause of deviations of the probability distribution of the LLRs, to improve the performance.

Further, the LDPC decoder has a category of an RA structure (which is an abbreviation of Repeat Accumulate structure and is also called a "zig-zag structure") within the plurality of categories in the Tanner graph, wherein the weighting of that category may be larger than the weighting of other categories, so that the LDPC decoder of the present invention can effectively improve the characteristics through the introduction of the RA structure, correct a difference with the other categories of LLRs with large deviations, and further improve the performance.

Further, each node forming part of a graph can be classified into a plurality of groups according to the column weight of a test matrix thereof in a Tanner graph in an LDPC coding scheme, and the weighting previously determined for each of the groups is performed on a log-likelihood ratio (hereinafter abbreviated as "LLR") subjected to a propagation in a probability propagation calculation in iterative decoding, so that the LDPC decoder of the present invention can unify deviations of LLR on a group-by-group basis, can make a correction with appropriate weighting, and can have the effect of improving performance.

Further, each node can be classified into a plurality of categories in a Tanner graph in an LDPC coding scheme, and the number of divided memory banks for storing a log-likelihood ratio (LLR) subjected to propagation is changed in accordance with the weight distribution of a test matrix belonging to each category to enable parallel access to the log-likelihood ratio, so that the LDPC decoder of the present invention effectively enables efficient fast operations having low complexity through an appropriate division of the memory banks.

Further, each node can be classified into a plurality of categories in a Tanner graph in an LDPC coding scheme, and has a structure for changing the number of divided memory banks for storing a log-likelihood ratio (LLR) subjected to propagation in accordance with the weight distribution of a test matrix belonging to each category, where parallel access to the log-likelihood ratio is performed through a caching circuit having a FIFO function, so that the LDPC decoder, of the present invention can effectively take an average even if accesses temporarily concentrate, reduce the chip area of an LSI by increasing the number of divided memory banks and by reducing the number of on-chip buses, and reduce the cost.

Further, the LDPC decoder of the present invention also has a second minimum value detector circuit for detecting a first minimum value by using a first minimum value detector circuit, for masking an input corresponding to the detected first minimum value, and for detecting a second minimum value when the probability propagation calculation in the iterative decoding is performed by the MaxLog approximation (also called the "minSum algorithm"), wherein the first and second minimum value circuits may be configured by a pipeline structure, thereby equivalently executing an approximation calculation in one clock, so that fast operations can be effectively realized in a small circuit scale.

Further, the LDPC decoder of the present invention has a first memory for temporarily storing LLRs for variable nodes when the probability propagation calculation in iterative decoding processing is performed by the MaxLog approximation (also called the "minSum algorithm"), and has a second memory for check nodes for preserving the first minimum value and the second minimum value according to claim 7, and has a polarity signal which is caused by modulo-2 addition of inputs thereof, wherein inputs to the first memory are sequentially performed by adding to a preserved value of the first memory based on a connection determined by the Tanner graph based on the first minimum value and the second minimum value, and the first memory is classified into categories, the weighting previously determined for each category is performed for the first memory output. Since the decoder can implement iterative decoding which includes adding the weighted LLR and a received value LLR, thereafter subtracting a value selected by connection information determined by the Tanner graph based on the first minimum value and the second minimum value as well as the polarity signal which is caused by modulo-2 addition, which are the second memory accumulation result, and subsequently includes again performing the MaxLog approximation (also called the "minSum algorithm"), thus effectively increasing the circuit scale reduction effect with the aid of a small memory configuration and approximation, the speed, and the performance through an appropriate weighting correction.

Further, since the LDPC decoder of the present invention takes into account the weighting for each category performed on the first memory input or on a path returning to a MaxLog approximation (also called the "minSum algorithm") output, rather than the first memory output, a degree of freedom is effectively provided in designing the LDPC decoder.

Further, since the connection information determined by the Tanner graph takes the form of preserving the positions of in the test matrix in the form of an index, the LDPC decoder of the present invention effectively holds the connection information by using a small memory capacity, and reduces the circuit scale.

Further, the LDPC decoder of the present invention has two planes of first memory for temporarily preserving LLRs for the variable nodes, and two planes of second memory for check nodes for preserving the first minimum value and the second minimum value according to claim 7, and a polarity signal which is caused by modulo-2 addition of inputs thereof, wherein when one of the memories is used as an output, the other memory is used as an input, and the input and output of the memories may be alternately switched from one repeated cycle to another in the iterative decoding, so that the speed can be increased two times with efficient use of memory.

Further, an LDPC encoder of the present invention has means 1 for producing matrixes A, B, T having the relationship of an upper triangular zero matrix represented by:

$$H = \begin{bmatrix} A & B & T \\ C & D & E \end{bmatrix}$$ [Equation 7]

including lower triangular matrix T having 1's at diagonal elements by a matrix manipulation of test matrix H, further having means 2 for producing matrix F represented by:

$$F=(-E \cdot T^{-1} \cdot B+D)^{-1} \cdot (E \cdot T^{-1} \cdot A-C)$$ [Equation 8]

from the upper triangular zero matrix, wherein means 1 and 2 are previously calculated offline processes, and have memory 1 for accumulating the positions of elements 1's in resulting matrix F in the form of an index, a memory 2 for storing information bit series S, and a first row counter, having a first circuit for producing first parity series p1 by taking an exclusive OR of the output of the second memory further addressed by an index output by the memory 1 addressed by the first row counter, having a memory 3 for storing a series represented by:

$$-A \cdot s^T - B \cdot p_1^T$$ [Equation 9]

by taking a product of parity series p1 and matrix B resulting from the offline process, taking a product of information bit series S and matrix A resulting from the offline process, and taking an exclusive OR of the products, having memory 4 for accumulating the positions of the elements 1 of matrix T resulting from the offline process in the form of index, a memory 5 for storing second parity series p2, and a second row counter, and having a second circuit for taking an exclusive OR of the output of the memory 5 sequentially read and addressed further by an index output by the memory 4 addressed by the second row counter, and the output of the memory 3 addressed by the second row counter to produce second parity series p2, and writing memory 4 written and addressed by the second row counter, wherein encoding processing is performed by the offline process and an online process by the first and second circuits, so that the LDPC encoder effectively holds the validity of a sparse test matrix, and can effectively implement encoding processing with a small memory capacity and a small circuit scale resulting from a simple exclusive OR operation.

Further, since memory 5 for storing second parity series p2 comprises a number of mirror memories equal to the number of row weights of matrix T, memory 4 for storing the positions of 1's of elements of matrix T as indexes is formatted to output a number of indexes equal to the number of row weights to a unit address, and these indexes are read and addressed to each mirror memory to perform on exclusive OR operation on the row weights at one time, the LDPC encoder of the present invention effectively performs the encoding processing at high speeds.

The LDPC coding scheme of the present invention calculates a probability propagation on a two-part graph called the "Tanner graph" which is a coding structure completely different from the turbo code disclosed in Patent Document 1, thereby executing iterative decoding processing. In the probability propagation calculation in the iterative decoding, nodes which form part of the Tanner graph are classified into a plurality of categories, and weighting previously determined independently for each classified category is performed on a log-likelihood ratio subjected to a propagation, which comprises the present invention. In this way, not only elimination of error floor but also higher performance is accomplished. Since the present invention analyzes non-linear processing by MaxLog approximation (minSum algorithm), the relationship of "Symmetry condition" is no longer preserved, so that the approach of the present invention must be used.

The present invention is an encoder and a decoder of the LDPC coding scheme and does not claim an analysis method therefor. Also, the analysis method which theoretically underlies the present invention is different from Patent Document 3, and an analysis method disclosed in Patent Document 3 cannot analyze the coding scheme of the present invention.

Effects of the Invention

As described above, the encoder and decoder according to the LDPC coding scheme of the present invention can provide means which can accomplish higher performance, higher speeds, and efficiency in a feasible circuit scale in the field of communications such as mobile communications as well.

For this purpose, each node of the Tanner graph is classified into a plurality of categories, the processing scale is reduced by a low weight distribution, and a significant reduction in circuit scale is effective through a daring approximation in a Min(Max) Log region instead of sum-product, and the present invention can provide means which can accomplish higher performance, higher speeds, and efficiency without degradation in performance induced thereby.

Further, the present invention can provide a decoder which comprises higher performance, higher speeds, and efficiency with a test matrix having low weight distribution, while the encoder can also benefit from the test matrix having low weight distribution and can provide means which can implement an architecture which operates at high speeds.

BRIEF DESCRIPTION OF THE DRAWINGS

FIG. 3 A diagram showing an example of a test matrix which is classified into categories according to the LDPC coding scheme of the present invention.

FIG. 4 A diagram showing an example of a weighting distribution of variable nodes and check nodes classified into categories according to the LDPC coding scheme of the present invention.

DESCRIPTION OF REFERENCE NUMERALS

Figure 1:
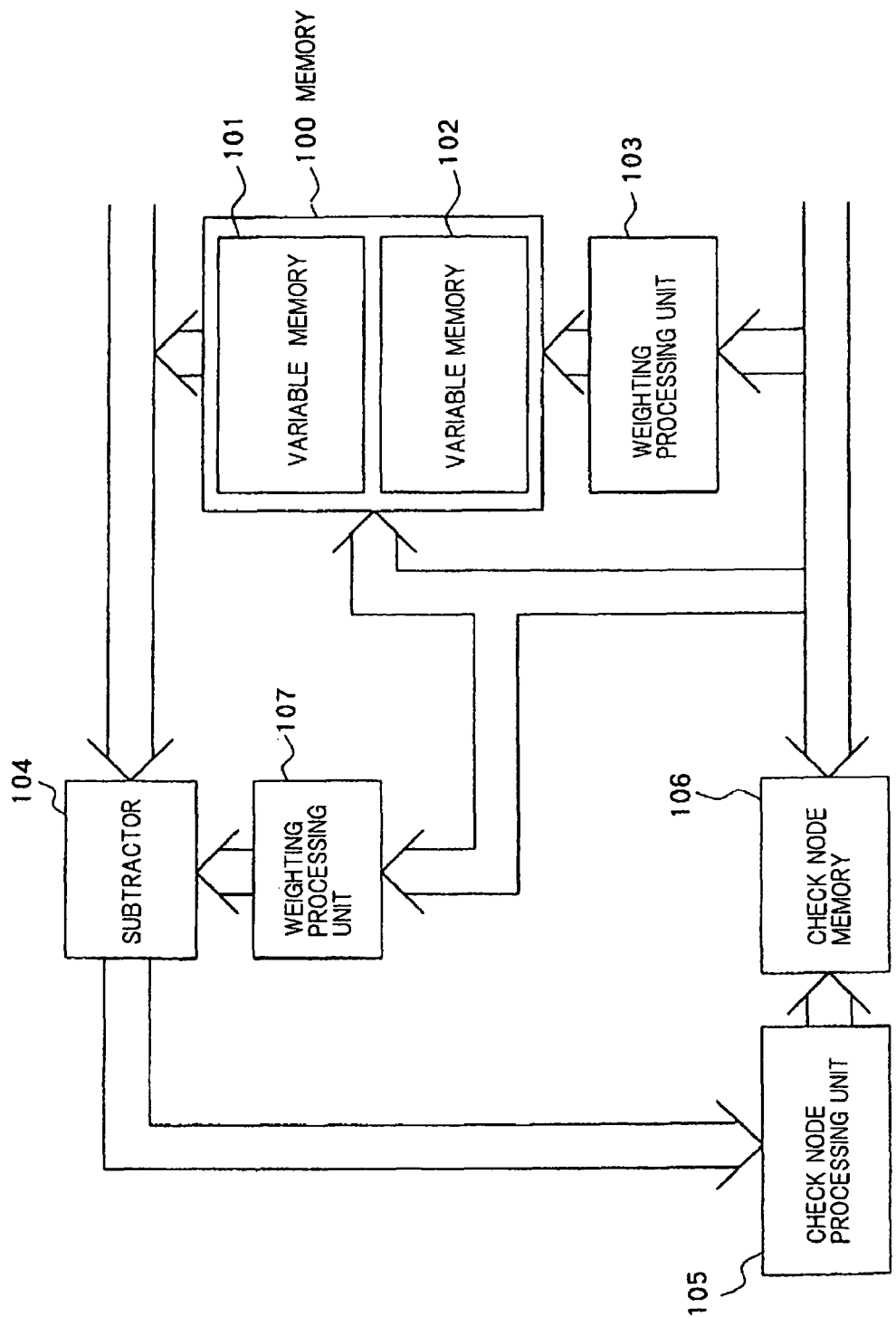
FIG. 1 A diagram illustrating an embodiment of a decoder according to an LDPC coding scheme of the present invention.

101 Memory for Storing Variable Node LLR
102 Memory for Storing Variable Node LLR
103 Weighting Processing Unit
104 Subtractor
105 Check Node Processing Unit
106 Check Node Memory
107 Weighting Processing Unit
801 First Memory
802 Second Memory
803 First Row Counter
804 Exclusive OR
805 Delay Element
806 Memory for Parity Series p1
901 Third Memory
902 Fourth Memory
903 Fifth Memory
904 Row Counter
905 Exclusive OR
906 Delay Element
1001 Third Memory
1002 Fourth Memory
1003 Fifth Memory
1003-1, 2 Mirror Memories
1004 Second Row Counter
1005 Exclusive OR

BEST MODE FOR CARRYING OUT THE INVENTION

Next, prior to describing embodiments of the present invention with reference to equations and drawings, a description will be first given of an analysis which is the background of the present invention together with a description of an analytical result by density evolution (hereinafter abbreviated as "DE") including non-linear processing resulting from a MaxLog approximation (called the "minSum algorithm" as well).

First, a description will be given of the difference between normal DE by Gaussian Approximation (hereinafter abbreviated as "GA") and DE including non-linear processing.

The normal GA is performed by tracing a mean value of LLR which is to be propagated on the premise of iterative decoding processing by sumproduct. Specifically, for symbol $v_i$ of column weight i, its mean value $m_{v,i}$ is:

[Equation 10]

$$m_{v,i} = E[v_i] = m_{u_0} + (i-1) \cdot m_u \quad (1)$$

Assuming in an ensemble average, when the order distribution of variable nodes is expressed by:

[Equation 11]

$$\lambda(x) = \sum_{i=2}^{d_v} \lambda_i \cdot x^{i-1}$$

the following relationship is derived.

[Equation 12]

$$E\left[\tanh\left(\frac{v}{2}\right)\right] = \sum_{i=2}^{d_l} \lambda_i \cdot E\left[\tanh\left(\frac{v_i}{2}\right)\right] \quad (2)$$

Here, using a variance, later described, and a condition for the mean value:

[Equation 13]

$$\sigma^2 = 2 \cdot \mu$$

[Equation 14]

$$E\left[\tanh\left(\frac{v_i}{2}\right)\right] = \frac{1}{\sqrt{4\pi \cdot m_{v,i}}} \int \tanh\left(\frac{v_i}{2}\right) \cdot \exp\left[-\frac{(v_i - m_{v,i})^2}{4 m_{v,i}}\right] du \quad (3)$$

Using $\Phi(x)$ which satisfies:

[Equation 15]

where; Gaussian;

$$\frac{1}{\sqrt{2\pi\sigma^2}} \exp\left[-\frac{x^2}{2\sigma^2}\right], \sigma^2 = 2m \quad (4)$$

$$\phi(x) = \begin{cases} 1 - \frac{1}{\sqrt{4\pi \cdot x}} \int \tanh\left(\frac{u}{2}\right) \cdot \exp\left[-\frac{(u-x)^2}{4x}\right] du & \text{if } x > 0 \\ 1 & \text{if } x = 0 \end{cases}$$

[Equation 16]

$$E\left[\tanh\left(\frac{v_i}{2}\right)\right] = 1 - \phi(m_{v,i})$$

is derived. Accordingly, the following relationship is derived.

[Equation 17]

$$E\left[\tanh\left(\frac{v}{2}\right)\right] = \sum_{i=2}^{d_l} \lambda_i \cdot (1 - \varphi(m_{v,i})) = \quad (5)$$

$$\sum_{i=2}^{d_l} (\lambda_i - \lambda_i \cdot \varphi(m_{v,i})) = 1 - \sum_{i=2}^{d_l} \lambda_i \cdot \varphi(m_{v,i}) \because \sum_{i=2}^{d_l} \lambda_i = 1$$

Also, in accordance with "tan h rule" in the sum-product decoding method, mean value $m_{u,j}$ for symbol $u_j$ with row weight j is:

[Equation 18]

-continued $$1 - \phi(m_{u,j}) = \quad (6)$$

$$E\left[\tanh\left(\frac{u_j}{2}\right)\right] = E\left[\tanh\left(\frac{v}{2}\right)\right]^{j-1} \therefore m_{u,j} = \phi^{-1}\left(1 - E\left[\tanh\left(\frac{v}{2}\right)\right]^{j-1}\right)$$

Assuming that the order distribution of check nodes is expressed by:

[Equation 19]
$$\rho(x) = \sum_{i=2}^{d_c} \rho_j \cdot x^{j-1}$$

assuming an in ensemble average,

[Equation 20]
$$m_u = \sum_{j=2}^{d_r} \rho_j \cdot m_{u,j}$$

Using the aforementioned $\Phi(x)$,

[Equation 21]
$$E\left[\tanh\left(\frac{u_j}{2}\right)\right] = 1 - \phi(m_{u,j})$$

and

[Equation 22]
$$m_{u,j} = \phi^{-1}\left(1 - E\left[\tanh\left(\frac{v^{(l)}}{2}\right)\right]^{j-1}\right)$$

Accordingly, after all,

[Equation 23]
$$m_u = \sum_{j=2}^{d_r} \rho_j \cdot \phi^{-1}\left(1 - E\left[\tanh\left(\frac{v^{(l)}}{2}\right)\right]^{j-1}\right) \quad (7)$$

Further, using

[Equation 24]
$$E\left[\tanh\left(\frac{v}{2}\right)\right] = \sum_{i=2}^{d_l} \lambda_i \cdot (1 - \varphi(m_{v,i})) =$$
$$\sum_{i=2}^{d_l} (\lambda_i - \lambda_i \cdot \varphi(m_{v,i})) = 1 - \sum_{i=2}^{d_l} \lambda_i \cdot \varphi(m_{v,i})$$

in Equation (5), the following equation is derived:

[Equation 25]
$$m_u = \sum_{j=2}^{d_r} \rho_j \cdot \phi^{-1}\left(1 - \left[1 - \sum_{i=2}^{d_l} \lambda_i \cdot \phi(m_{v,i})\right]^{j-1}\right) \quad (8)$$

Further, using $$m_{v,j} = E[v_i] = m_{u_u} + (l-1) \cdot m_u \quad \text{[Equation 26]}$$

in Equation (1), the following recursive equation for singularity is derived:

[Equation 27]
$$m_u = \sum_{j=2}^{d_r} \rho_j \cdot \varphi^{-1}\left(1 - \left[1 - \sum_{i=2}^{d_l} \lambda_i \cdot \varphi(m_{u0} + (i-1) \cdot m_u)\right]^{j-1}\right) \quad (9)$$

Average behavior in the iterative decoding process can be seen by the above Equation (9) which is a recursive equation under a previously given order profile. Development to infinity over time results in error free operation, whereas the development that is stopped in the middle cannot result in the realization of an error free operation. The boundary therebetween is called a repetition threshold (Threshold), and Eb/No corresponding to an averaged received LLR value:

$$m_{u_0} \quad \text{[Equation 28]}$$

is a level required to realize error free operation.

Here, a parameter for tracing the developing process of the aforementioned equation may be only one variable. This can be seen from the following example which is easy to understand. Assuming now taking into consideration an Hyperbolic Tangent Rule in the case of row weight $d_c$,

[Equation 29]
$$\tanh\left(\frac{u}{2}\right) = \prod_{k=1}^{d_c-1} \tanh\left(\frac{v_k}{2}\right)$$

so that an expected value must be considered the statistical nature (variance $\sigma_u^2$ and mean value $m_u$) for random variable u on the left side, and the statistical nature (variance $\sigma_v^2$ and mean value $m_v$) for a random variable on the right side:

$$v_k \, k=1,2,\ldots,d_0-1 \quad \text{[Equation 30]}$$

Here, assuming first variance on the right side,

[Equation 31]
$$E\left[\left\{\prod_{k=1}^{d_c-1} \tanh\left(\frac{v_k}{2}\right) - E\left[\prod_{k=1}^{d_c-1} \tanh\left(\frac{v_k}{2}\right)\right]\right\}^2\right] = \quad (10)$$
$$E\left[\left\{\prod_{k=1}^{d_c-1} \tanh\left(\frac{v_k}{2}\right)\right\}^2\right] - \left\{E\left[\prod_{k=1}^{d_c-1} \tanh\left(\frac{v_k}{2}\right)\right]\right\}^2$$

Here, assuming that:

$$v_k \, k=1,2,\ldots,d_0-1 \quad \text{[Equation 32]}$$

are independent of one another and have the same statistical nature,

[Equation 33]

-continued $$E\left[\prod_{k=1}^{d_c-1} \tanh\left(\frac{v_k}{2}\right)\right] = \tag{11}$$

$$\prod_{k=1}^{d_c-1} E\left[\tanh\left(\frac{v_k}{2}\right)\right] = \prod_{k=1}^{d_c-1} E\left[\tanh\left(\frac{v_k}{2}\right)\right] = (1-\varphi(m_v))^{d_c-1}$$

where;

$$\varphi(x) =$$

$$1 - E\left[\tanh\left(\frac{v_k}{2}\right)\right] = 1 - \frac{1}{\sqrt{4\pi x}} \int_{-\infty}^{+\infty} \tanh\left(\frac{v_k}{2}\right) \cdot \exp\left[-\frac{(v_k-x)^2}{4x}\right] dv_k$$

where:

[Equation 34]

$$\begin{cases} E\left[\tanh\left(\frac{x}{2}\right)\right] = \frac{1}{\sqrt{2\pi\sigma^2}} \int_{-\infty}^{+\infty} \tanh\left(\frac{x}{2}\right) \cdot \exp\left[-\frac{(x-m)^2}{2\sigma^2}\right] dx = \\ \qquad \frac{1}{\sqrt{4\pi m}} \int_{-\infty}^{+\infty} \tanh\left(\frac{x}{2}\right) \cdot \exp\left[-\frac{(x-m)^2}{4m}\right] dx \ (\because \sigma^2 = 2 \cdot m) \\ E\left[\tanh^2\left(\frac{x}{2}\right)\right] = \frac{1}{\sqrt{2\pi\sigma^2}} \int_{-\infty}^{+\infty} \tanh^2\left(\frac{x}{2}\right) \cdot \exp\left[-\frac{(x-m)^2}{2\sigma^2}\right] dx = \\ \qquad \frac{1}{\sqrt{4\pi m}} \int_{-\infty}^{+\infty} \tanh^2\left(\frac{x}{2}\right) \cdot \exp\left[-\frac{(x-m)^2}{4m}\right] dx \ (\because \sigma^2 = 2 \cdot m) \end{cases} \tag{12}$$

The difference between both is:

[Equation 35]

$$E\left[\tanh\left(\frac{x}{2}\right)\right] - E\left[\tanh^2\left(\frac{x}{2}\right)\right] = \tag{13}$$

$$\frac{1}{\sqrt{4\pi m}} \int_{-\infty}^{+\infty} \tanh\left(\frac{x}{2}\right)\left\{1 - \tanh\left(\frac{x}{2}\right)\right\} \cdot \exp\left[-\frac{(x-m)^2}{4m}\right] dx$$

In the above equation, a fixed value is omitted because it is not related to whether or not "0" is derived, and a non-integral term is seen in the following manner for tan h in an exponential representation:

[Equation 36]

$$\left(\frac{e^x - 1}{e^x + 1}\right) \cdot \left(1 - \frac{e^x - 1}{e^x + 1}\right) \cdot e^{-\frac{(x-m)^2}{4m}} = \tag{14}$$

$$\left(\frac{e^x - 1}{e^x + 1}\right) \cdot \left(\frac{2}{e^x + 1}\right) \cdot e^{-\frac{(x-m)^2}{4m}} = \frac{2e^x - 2}{(e^x + 1)^2} \cdot e^{-\frac{x^2}{4m}} \cdot e^{\frac{x}{2}} \cdot e^{-\frac{m}{4}}$$

The last element:

$$e^{-\frac{m}{4}} \qquad \text{[Equation 37]}$$

in the above equation is omitted because it does not include an integral variable but is a fixed value, and a remaining non-integral function is expressed by:

$$f(x) \qquad \text{[Equation 38]}$$

[Equation 39]

$$f(x) = \frac{2e^x - 2}{(e^x + 1)^2} \cdot e^{-\frac{x^2}{4m}} \cdot e^{\frac{x}{2}} \tag{15}$$

A symmetry function f(−x) of this function is expressed by:

[Equation 40]

$$f(-x) = \frac{2e^{-x} - 2}{(e^{-x} + 1)^2} \cdot e^{-\frac{x^2}{4m}} \cdot e^{-\frac{x}{2}} = \tag{16}$$

$$\frac{2 - 2e^x}{(1+e^x)^2} \cdot \frac{e^{-x}}{e^{-2x}} \cdot e^{-\frac{x}{2}} \cdot e^{-\frac{x^2}{4m}} = -\frac{2e^x - 2}{(e^x+1)^2} \cdot e^{\frac{x}{2}} \cdot e^{-\frac{x^2}{4m}} = -f(x)$$

It is understood that the non-integral function:

$$f(x) \qquad \text{[Equation 41]}$$

is an odd function. Therefore, $$\int_{-\infty}^{+\infty} f(x) dx = 0 \qquad \text{[Equation 42]}$$

is established. In GA which satisfies arbitrary $$(\sigma^2 = 2m) \qquad \text{[Equation 43]}$$

[Equation 44]

$$E\left[\tanh\left(\frac{u}{2}\right)\right] = E\left[\tanh^2\left(\frac{u}{2}\right)\right] \tag{17}$$

Therefore, the first term of variance in Equation (10) is:

[Equation 45]

$$E\left[\left\{\prod_{k=1}^{d_c-1} \tanh\left(\frac{v_k}{2}\right)\right\}^2\right] = E\left[\prod_{k=1}^{d_c-1} \tanh^2\left(\frac{v_k}{2}\right)\right] = \tag{18}$$

$$\prod_{k=1}^{d_c-1} E\left[\tanh^2\left(\frac{v_k}{2}\right)\right] = \prod_{k=1}^{d_c-1} E\left[\tanh\left(\frac{v_k}{2}\right)\right] = (1-\varphi(m_v))^{d_c-1}$$

Accordingly, the variance in Equation (10) is:

[Equation 46]

$$E\left[\left\{\prod_{k=1}^{d_c-1} \tanh\left(\frac{v_k}{2}\right) - E\left[\prod_{k=1}^{d_c-1} \tanh\left(\frac{v_k}{2}\right)\right]\right\}^2\right] = \tag{19}$$

$$(1-\varphi(m_v))^{d_c-1} - ((1-\varphi(m_v))^{d_c-1})^2$$

Next, taking into consideration the variance on the left side with the statistical nature (variance $\sigma_u^2$ and mean value $m_u$) for random variable u on the left side,

[Equation 47]

$$E\left[\left\{\tanh\left(\frac{u}{2}\right) - E\left[\tanh\left(\frac{u}{2}\right)\right]\right\}^2\right] = \left[\left\{\tanh\left(\frac{u}{2}\right)\right\}^2\right] - \left\{E\left[\tanh\left(\frac{u}{2}\right)\right]\right\}^2 = \quad (20)$$
$$E\left[\tanh\left(\frac{u}{2}\right)\right] - \left\{E\left[\tanh\left(\frac{u}{2}\right)\right]\right\}^2 =$$
$$(1 - \varphi(m_u)) - (1 - \varphi(m_u))^2 \quad (\because Eq(17))$$

After all, since the relationship between the left side and right side is:

[Equation 49]

$$\text{Var}\left\{\tanh\left(\frac{u}{2}\right)\right\} = \text{Var}\left\{\prod_{k=1}^{d_c-1}\tanh\left(\frac{v_k}{2}\right)\right\}$$

from

[Equation 48]

$$\tanh\left(\frac{u}{2}\right) = \prod_{k=1}^{d_c-1}\tanh\left(\frac{v_k}{2}\right)$$

a balanced state can be held by the statistical natures (variance $\sigma_u^2$ and mean value $m_u$) and (variance $\sigma_v^2$ and mean value $m_v$) on both sides which can satisfy:

[Equation 50]

$$(1 - \varphi(m_u)) - (1 - \varphi(m_u))^2 \Leftrightarrow (1 - \varphi(m_v))^{d_c-1} - ((1 - \varphi(m_v))^{d_c-1})^2 \quad (21)$$

In other words, u which has the statistic nature (variance $\sigma_u^2$ and mean value $m_u$) which establish this condition is the output.

On the other hand, in regard to the average, seeing whether or not the state is preserved without contradicting to the foregoing result,

[Equation 51]

$$E\left[\tanh\left(\frac{u}{2}\right)\right] = E\left[\prod_{k=1}^{d_c-1}\tanh\left(\frac{v_k}{2}\right)\right]$$

From this, the right side is:

[Equation 52]

$$E\left[\prod_{k=1}^{d_c-1}\tanh\left(\frac{v_k}{2}\right)\right] = \prod_{k=1}^{d_c-1}E\left[\tanh\left(\frac{v_k}{2}\right)\right] = (1 - \phi(m_v))^{d_c-1}$$

Of course, the left side is:

[Equation 53]

$$E\left[\tanh\left(\frac{u}{2}\right)\right] = (1 - \phi(m_u))$$

Therefore, from the viewpoint of the mean value, a balanced state can be held by the statistical natures (variance $\sigma_u^2$ and mean value $m_u$) and (variance $\sigma_v^2$ and mean value $m_v$) on both sides which can satisfy:

[Equation 54]

$$(1 - \phi(m_u)) \Leftrightarrow (1 - \phi(m_v))^{d_c-1} \quad (22)$$

Reviewing the relation between Equation (21) and Equation (22), for example, when the left side of Equation (21) is calculated using a condition which satisfies the relationship of Equation (22);

[Equation 55]

$$\text{Var}\left\{\tanh\left(\frac{u}{2}\right)\right\} = (1 - \varphi(m_u)) - (1 - \varphi(m_u))^2 = \quad (23)$$
$$(1 - \varphi(m_v))^{d_c-1}((1 - \varphi(m_v))^{d_c-1})^2 = \text{Var}\left\{\prod_{k=1}^{d_c-1}\tanh\left(\frac{v_k}{2}\right)\right\}$$

from which it is understood that the relationship of Equation (21) and Equation (22), i.e., the relationship between the mean value and variance, is established without contradiction. In other words, the trace of the mean value and its variance in Hyperbolic Tangent Rule simultaneously trace the variance as well even with a trace of the mean value alone, one variable may only be observed.

Since this relationship treats random variables as being independent of each other, it is also established for a random variable for a statistical environment which differs depending on $\Phi(*)$. Therefore, it can be used as it is for a Tanner graph which is classified into categories shown below. In the following, GA is noted in the Tanner graph classified into the categories.

In the GA of the conventional singular LDPC, all LLRs have been handled as a single mean value in an ensemble averaged form. In a Tanner graph classified into categories, each category is ensemble averaged, so that a detailed and correct process can be evaluated in correspondence. Specifically, messages from a variable node to a check node, and from a check node to a variable node are considered separately on a category-by-category basis. Assume now that the number of categories is $n_e$, and branches $d_j$ of categories j ($\neq$i) are connected to check nodes (variable nodes) as a direction in which a branch of one region of category i goes out, and as a direction in which (di−1) branches of category i enter. Consider GA in this state.

While a mean value of each update process by SumProduct is traced, consideration is made separately on a category-by-category basis, a vector representation is used for an order:

$$d = (d_1, d_2, \ldots, d_{u_0}) \quad \text{[Equation 57]}$$

which is collected for each $$v_{b,d}(\text{i.e. } 0.5, 0.3, 0.2, 0.2) \quad \text{[Equation 56]}$$

In other words, a mean value of column weight $d_i$ in category i with arbitrary order d for message $V(i)_d$:

$$m(i)_{v,d} \quad \text{[Equation 58]}$$

is:

[Equation 59]

-continued $$m(i)_{v,d} = E[V(i)_d] = m(i)_{u_0} + (d_i - 1) \cdot m(i)_u + \sum_{\substack{j=1 \\ j \neq 1}}^{n_e} d_j \cdot m(j)_u \quad (24)$$

Here, the following relationship:

[Equation 61]

$$v_{x_i}(r, x) \equiv \frac{dv(r, x)}{dx_i} = \quad (25)$$

$$\frac{d}{dx_i} \left( \sum_{b,d} v_{b,d} \cdot r^b \cdot x^d \right) = \frac{d}{dx_i} \left( \sum_{b,d} v_{b,d} \cdot \prod_{j=0}^{n_\tau} r_j^{b_j} \cdot \prod_{j=1}^{n_e} x_j^{d_j} \right) =$$

$$\sum_{\substack{b,d \\ d_i \neq 0}} d_i \cdot v_{b,d} \cdot \left( \prod_{j=0}^{n_\tau} r_j^{b_j} \right) \cdot \left( x_i^{d_i - 1} \cdot \prod_{\substack{j=1 \\ j \neq 1}}^{n_e} x_j^{d_j} \right) \therefore v_{x_i}(1, 1) =$$

$$\sum_{\substack{b,d \\ d_i \neq 0}} d_i \cdot v_{b,d}$$

is used for noting the proportion of branches connected to nodes of the order arbitrarily selected within branches of category i:

$$d = (d_1, d_2, \ldots, d_{n_0}) \quad \text{[Equation 60]}$$

Since the total number of branches in category i is:

$$\sum_{\substack{d \\ d_i \neq 0}} d_i \cdot v_{b,d} \quad \text{[Equation 62]}$$

the proportion of branches connected to the nodes of the arbitrarily selected order:

$$\sum_{\substack{d \\ d_i \neq 0}} d_i \cdot v_{b,d} \quad \text{[Equation 63]}$$

is, after all, $$\frac{d_i \cdot v_{b,d}}{\sum_{\substack{b,d \\ d_i \neq 0}} d_i \cdot v_{b,d}} = \frac{d_i \cdot v_{b,d}}{v_{x_i}(1, 1)} \quad \text{[Equation 64]}$$

Accordingly, the following relationship is derived, taking into consideration in ensemble average in category i:

[Equation 65]

$$E\left[\tanh\left(\frac{V(i)}{2}\right)\right] = \sum_{\substack{d \\ d_i \neq 0}} \frac{d_i \cdot v_{b,d}}{v_{x_i}(1, 1)} \cdot E\left[\tanh\left(\frac{V(i)_d}{2}\right)\right] \quad (26)$$

Here, using $\Phi(x)$, $$E\left[\tanh\left(\frac{V(i)_d}{2}\right)\right] = 1 - \phi(m(i)_{v,d}) \quad \text{[Equation 66]}$$

Therefore, the following relationship is derived:

[Equation 67]

$$E\left[\tanh\left(\frac{V(i)}{2}\right)\right] = \sum_{\substack{d \\ d_i \neq 0}} \frac{d_i \cdot v_{b,d}}{v_{x_i}(1, 1)} \cdot (1 - \varphi(m(i)_{v,d})) = \quad (27)$$

$$\sum_{\substack{d \\ d_i \neq 0}} \left( \frac{d_i \cdot v_{b,d}}{v_{x_i}(1, 1)} - \frac{d_i \cdot v_{b,d}}{v_{x_i}(1, 1)} \cdot \varphi(m(i)_{v,d}) \right) =$$

$$1 - \sum_{\substack{d \\ d_i \neq 0}} \left( \frac{d_i \cdot v_{b,d}}{v_{x_i}(1, 1)} \cdot \varphi(m(i)_{v,d}) \right) \because \sum_{\substack{d \\ d_i \neq 0}} \left( \frac{d_i \cdot v_{b,d}}{v_{x_i}(1, 1)} \right) =$$

$$\frac{\sum_{\substack{d \\ d_i \neq 0}} d_i \cdot v_{b,d}}{v_{x_i}(1, 1)} = \frac{v_{x_i}(1, 1)}{v_{x_i}(1, 1)} = 1$$

Assuming in a similar manner that $d_j$ branches of category j ($\neq$ i) are connected as the direction in which (di−1) branches of category i enter, since the consideration is made separately on a category-by-category basis, a vector representation is used for an order:

$$d = (d_1, d_2, \ldots, d_{u_0}) \quad \text{[Equation 69]}$$

which is collected for each $$v_{b,d}(\text{i.e. } 0.5, 0.3, 0.2, 0.2) \quad \text{[Equation 68]}$$

A mean value for LLRU(i)$_d$ of column weight $d_i$ within category i with arbitrary order d:

$$m(i)_{u,d} \quad \text{[Equation 70]}$$

is:

[Equation 71]

$$1 - \varphi(m(i)_{U,d}) = \quad (28)$$

$$E\left[\tanh\left(\frac{U(i)_d}{2}\right)\right] = E\left[\tanh\left(\frac{V(i)}{2}\right)\right]^{i-1} \cdot \prod_{\substack{(j=1) \\ j \neq 1}}^{n_e} E\left[\tanh\left(\frac{V(j)}{2}\right)\right]^j \therefore m(i)_{U,d} =$$

$$\varphi^{-1}\left(1 - E\left[\tanh\left(\frac{V(i)}{2}\right)\right]^{i-1} \cdot \prod_{\substack{j=1 \\ j \neq 1}}^{n_e} E\left[\tanh\left(\frac{V(j)}{2}\right)\right]^j\right)$$

using "tan h rule" in sumProduct. Here, the following relationship:

[Equation 73]

-continued $$\mu_{x_i}(x) \equiv \frac{d\mu(x)}{dx_i} = \frac{d}{dx_i}\left(\sum_d \mu_d \cdot x^d\right) = \frac{d}{dx_i}\left(\sum_d \mu_d \cdot \prod_{j=1}^{n_e} x_j^{d_j}\right) = \qquad (29)$$

$$\sum_{\substack{d \\ d_i \neq 0}} d_i \cdot \mu_d \cdot \left(x_i^{d_i-1} \cdot \prod_{\substack{j=1 \\ j \neq i}}^{n_e} x_j^{d_j}\right) \therefore \mu_{x_i}(1, 1) = \sum_{\substack{d \\ d_i \neq 0}} d_i \cdot \mu_d$$

is used for noting the proportion of branches connected to nodes of the order arbitrarily selected within branches of category i:

$$d=(d_1, d_2, \ldots, d_{u_0}) \qquad \text{[Equation 72]}$$

Since the total number of branches in category i is:

$$\sum_{\substack{d \\ d_i \neq 0}} d_i \cdot \mu_d \qquad \text{[Equation 74]}$$

the proportion of branches connected to the nodes of the arbitrarily selected order:

$$d=(d_1, d_2, \ldots, d_{u_0}) \qquad \text{[Equation 75]}$$

is:

$$\frac{d_i \cdot \mu_d}{\sum_{\substack{d \\ d_i \neq 0}} d_i \cdot \mu_d} = \frac{d_i \cdot \mu_d}{\mu_{x_i}(1)} \qquad \text{[Equation 76]}$$

Accordingly, the following relationship is derived, assuming an ensemble average in category i:

$$m(i)_U = \sum_{\substack{d \\ d_i \neq 0}} \frac{d_i \cdot \mu_d}{\mu_{x_i}(1)} \cdot m(i)_{U,d} \qquad \text{[Equation 77]}$$

Here, using $\Phi(x)$,

[Equation 78]
$$E\left[\tanh\left(\frac{U(i)_d}{2}\right)\right] = 1 - \phi(m(i)_{U,d})$$

From the above equation, $$m(i)_{U,d} = \phi^{-1}\left(1 - E\left[\tanh\left(\frac{V(i)}{2}\right)\right]^{i-1} \cdot \prod_{\substack{j=1 \\ j \neq 1}}^{n_e} E\left[\tanh\left(\frac{V(j)}{2}\right)\right]^j\right) \qquad \text{[Equation 79]}$$

After all,

[Equation 80]
$$m(i)_U = \sum_{\substack{d \\ d_i \neq 0}} \frac{d_i \cdot \mu_d}{\mu_{x_i}(1)} \cdot \phi^{-1}\left(1 - E\left[\tanh\left(\frac{V(i)}{2}\right)\right]^{i-1} \cdot \prod_{\substack{j=1 \\ j \neq 1}}^{n_e} E\left[\tanh\left(\frac{V(j)}{2}\right)\right]^j\right) \qquad (30)$$

Further since the aforementioned equation:

$$E\left[\tanh\left(\frac{V(i)}{2}\right)\right] = 1 - \sum_{\substack{d \\ d_i \neq 0}} \left(\frac{d_i \cdot v_{b,d}}{v_{x_i}(1,1)} \cdot \phi(m(i)_{v,d})\right) \qquad \text{[Equation 81]}$$

is similarly established for j as well, the following equation is derived:

[Equation 82]
$$m(i)_U = \sum_{\substack{d \\ d_i \neq 0}} \frac{d_i \cdot \mu_d}{\mu_{x_i}(1)} \cdot \phi^{-1}\left(\begin{array}{l} 1 - \left[1 - \sum_{\substack{d \\ d_i \neq 0}}\left(\frac{d_i \cdot v_{b,d}}{v_{x_i}(1,1)} \cdot \varphi(m(i)_{v,d})\right)\right]^{i-1} \bullet \\ \prod_{\substack{j=1 \\ j \neq i}}^{n_e}\left[1 - \sum_{\substack{d \\ d_i \neq 0}}\left(\frac{d_i \cdot v_{b,d}}{v_{x_i}(1,1)} \cdot \varphi(m(i)_{v,d})\right)\right]^j \end{array}\right) \qquad (31)$$

Further, using the foregoing:

$$m(i)_{v,d} = E[V(i)_d] = m(i)_{u_0} + (d_i - 1) \cdot m(i)_u + \sum_{\substack{j=1 \\ j \neq i}}^{n_e} d_j \cdot m(j)_u \qquad \text{[Equation 83]}$$

the following recursive equation is derived for GA in the Tanner graph classified into categories:

[Equation 84]
$$m(i)_u = \sum_{\substack{d \\ d_i \neq 0}} \frac{d_i \cdot \mu_d}{\mu_{x_i}(1)} \cdot \varphi^{-1}\left(\begin{array}{l} 1 - \left[1 - \sum_{\substack{d \\ d_i \neq 0}}\left(\frac{d_i \cdot v_{b,d}}{v_{x_i}(1,1)} \cdot \varphi\left(m(i)_{u0} + (d_i-1) \cdot m(i)_u + \sum_{\substack{j=1 \\ j \neq i}}^{n_e} d_j \cdot m(j)_u\right)\right)\right]^{i-1} \\ \times \prod_{\substack{j=1 \\ j \neq 1}}^{n_e}\left[1 - \sum_{\substack{d \\ d_i \neq 0}}\left(\frac{d_j \cdot v_{b,d}}{v_{x_j}(1,1)} \cdot \varphi\left(m(j)_{u0} + (d_j-1) \cdot m(j)_u + \sum_{\substack{k=1 \\ k \neq j}}^{n_e} d_k \cdot m(k)_u\right)\right)\right]^j \end{array}\right) \qquad (32)$$

Under a previously given order profile:

[Equation 85]

-continued $$\begin{cases} v(r, x) \equiv \sum_{b,d} v_{b,d} \cdot r^b \cdot x^d \equiv \sum_{b,d} v_{b,d} \cdot \prod_{i=0}^{n_T} r_i^{b_i} \cdot \\ \prod_{j=1}^{n_e} x_j^{d_j} \left( = \sum_{b,d} v_{b,d} \cdot r_0^{b_0} \cdot r_1^{b_1} \cdot \prod_{j=1}^{n_e} x_j^{d_j} \right) \\ \mu(x) \equiv \sum_d \mu_d \cdot x^d \equiv \sum_d \mu_d \cdot \prod_{j=1}^{n_e} x_j^{d_j} \end{cases} \quad (33)$$

an average behavior can be seen in a iterative decoding process by recursive equation (32). Error-free operation can be realized when mean value m evolves to infinity from one repetition to another, whereas error-free operation cannot be realized when the evolution stops in the middle. Its boundary is called a repetition threshold (Threshold), and $E_b/N_0$ corresponding to communication path LLR average $m(i)_{u0}$ $i=1-n_e$ at that time is a level required to realize error-free operation. Also, in the aforementioned equation,

[Equation 86]

$$\begin{cases} v_{x_i}(r, x) \equiv \frac{dv(r, x)}{dx_i} = \frac{d}{dx_i}\left(\sum_{b,d} v_{b,d} \cdot r^b \cdot x^d\right) = \\ \frac{d}{dx_i}\left(\sum_{b,d} v_{b,d} \cdot \prod_{j=0}^{n_T} r_j^{b_j} \cdot \prod_{j=1}^{n_e} x_j^{d_j}\right) \\ = \sum_{\substack{b,d \\ d_i \ne 0}} d_i \cdot v_{b,d} \cdot \left(\prod_{j=0}^{n_T} r_j^{b_j}\right) \cdot \left(x_i^{d_i-1} \cdot \prod_{\substack{j=1 \\ j \ne i}}^{n_e} x_j^{d_j}\right) \therefore v_{x_i}(1, 1) = \sum_{\substack{b,d \\ d_i \ne 0}} d_i \cdot v_{b,d} \\ \mu_{x_i}(x) \equiv \frac{d\mu(x)}{dx_i} = \frac{d}{dx_i}\left(\sum_d \mu_d \cdot x^d\right) = \frac{d}{dx_i}\left(\sum_d \mu_d \cdot \prod_{j=1}^{n_e} x_j^{d_j}\right) \\ = \sum_{\substack{d \\ d_i \ne 0}} d_i \cdot \mu_d \cdot \left(x_i^{d_i-1} \cdot \prod_{\substack{j=1 \\ j \ne i}}^{n_e} x_j^{d_j}\right) \therefore \mu_{x_i}(1) = \sum_{\substack{d \\ d_i \ne 0}} d_i \cdot \mu_d \end{cases} \quad (34)$$

is established.

The foregoing is the case where Hyperbolic Tangent Rule based on sumProduct is used, in which the relationship of Equation (21) and Equation (22), i.e., the relation of the mean value and variance, is established without contradiction even in iterative decoding processing. In other words, this is the case where only one variable may be observed because the trace of the mean value and its variance in Hyperbolic Tangent Rule is such that even the trace of the mean value alone simultaneously traces the variance as well.

However, in the case of GA which includes non-linear processing resulting from the MaxLog approximation (or also called "minSum algorithm"), the relationship of Equation (21), Equation (22) is no longer established, thus failing to obtain the merit of simultaneously tracing the variance only with a trace of the mean value alone.

Therefore, both the mean value and variance are traced during iterative decoding processing, and a determination is made depending on whether the SNR sufficiently grows. The performance is poor if the SNR stops increasing in the middle. A necessary level is determined with reference to $E_b/N_0$ corresponding to communication path LLR average $m(i)_{u0}$ $i=1-n_e$ at the boundary.

For this purpose, it is necessary to find a probability distribution in the MaxLog approximation (or also called the "minSum algorithm"). In the following, the probability distribution will be described giving an example in which a row weight is four.

Since the row weight is four, $d_c-1=3$, a probability distribution is to be found for three variables.

Assuming now processing in the row direction, a log-likelihood ratio at each node is labeled LLR. Accordingly, LLR is determined by dc-1 independent random variables, except for the number of nodes which are to be estimated, and the random variables are represented by:

$$Z=[z_1, z_2, \ldots, z_{d_0-1}] \quad \text{[Expression 87]}$$

in vector notation, and respective probability density function is represented as:

$$P_{z_j}(z_j, m_j, \sigma^2_j) \quad \text{[Equation 88]}$$

where $m_j$ is a mean value, and $\sigma^2 j$ is a variance. Further, the probability function is defined as follows. For

[Equation 85]

$$\begin{cases} v(r, x) \equiv \sum_{b,d} v_{b,d} \cdot r^b \cdot x^d \equiv \sum_{b,d} v_{b,d} \cdot \prod_{j=0}^{n_T} r_i^{b_i} \cdot \\ \prod_{j=1}^{n_e} x_j^{d_j} \left( = \sum_{b,d} v_{b,d} \cdot r_0^{b_0} \cdot r_1^{b_1} \cdot \prod_{j=1}^{n_e} x_j^{d_j} \right) \\ \mu(x) \equiv \sum_d \mu_d \cdot x^d \equiv \sum_d \mu_d \cdot \prod_{j=1}^{n_e} x_j^{d_j} \end{cases} \quad (33)$$

[Equation 90]

$$\begin{cases} \varphi_+(x, m_j, \sigma^2_j) = \int_x^{+\infty} P_{z_j}(z_j, m_j, \sigma^2_j) dz_j \\ \varphi_-(x, m_j, \sigma^2_j) = \int_{-\infty}^{-x} P_{z_j}(z_j, m_j, \sigma^2_j) dz_j \end{cases} \quad (35)$$

Specifically, $$\phi_+(x) \quad \text{[Equation 91]}$$

and $$\phi_-(x) \quad \text{[Equation 92]}$$

represent a random variable having a magnitude equal to or larger than x:

$$z_j \quad \text{[Equation 93]}$$

when it is positive and negative.

For finding $Q_L(x)$ which is a probability density distribution (pdf) of LLR, a cumulative probability distribution (cdf) is calculated.

$Pr(L<l)=Pr\{$odd number of negative value in Z, and
$|z_j|>|l|, \forall j\}$ [Equation 95]

is established for:

$$l<0 \quad \text{[Equation 94]}$$

Specifically, when all $$|z_j| \quad \text{[Equation 96]}$$

is equal to or larger than:

$|t|$ [Equation 97]

$\min\{|z_j|\}$ [Equation 98]

is also equal to or larger than:

$|l|$ [Equation 99]

Accordingly, even minimum $\min\{|z_j|\}$ [Equation 101]

in a negative region (odd number of negative value in Z) approximated by:

$$L \approx \left(\prod_{j \in \omega n} \mathrm{sgn}(z_j)\right) \cdot \min_{j \in \omega n}\{|z_j|\} \quad \text{[Equation 100]}$$

satisfies:

$|z_j| > |l|$ [Equation 102]

so that:

$L < l < 0$ [Equation 103]

is established, so that all events; in the region are defined by the following equation:

{Odd number of negative value in Z, and $|z_j| > |l|, \forall j$} [Equation 104]

are included in:

$Pr(L < l)$ [Equation 105]

Conversely, unless all $|z_j|$ [Equation 106]

are not equal to or larger than:

$|l|$ [Equation 107]

events equal to or smaller than:

$|l|$ [Equation 108]

exist without fail, so that they are not included in:

$Pr(L < l)$ [Equation 109]

Accordingly, cumulative distribution $F_L(l)$ with a row weight of four and three variables is:

[Equation 110]

at $l < 0$ (36)

$F_L(l) =$
$Pr(L < l) = \varphi_-(|l|, m_1, \sigma_1^2) \cdot \varphi_+(|l|, m_2, \sigma_2^2) \cdot \varphi_+(|l|, m_3, \sigma_3^2) +$
$\varphi_-(|l|, m_2, \sigma_2^2) \cdot \varphi_+(|l|, m_1, \sigma_1^2) \cdot \varphi_+(|l|, m_3, \sigma_3^2) +$
$\varphi_-(|l|, m_3, \sigma_3^2) \cdot \varphi_+(|l|, m_1, \sigma_1^2) \cdot \varphi_+(|l|, m_2, \sigma_2^2) +$
$\varphi_-(|l|, m_1, \sigma_1^2) \cdot \varphi_-(|l|, m_2, \sigma_2^2) \cdot \varphi_-(|l|, m_3, \sigma_3^2)$ Therefore, probability density distribution QL(l) of L to be found is derived by differentiating cumulative probability distribution (cdf) of L of the aforementioned Equation (36) by l:

[Equation 111]

-continued at $l < 0$ (37)

$Q_L(l) = P_{z_1}(z_1, m_1, \sigma_1^2) \cdot \varphi_+(|l|, m_2, \sigma_2^2) \cdot \varphi_+(|l|, m_3, \sigma_3^2) +$
$\varphi_-(|l|, m_1, \sigma_1^2) \cdot P_{z_2}(-z_2, m_2, \sigma_2^2) \cdot \varphi_+(|l|, m_3, \sigma_3^2) +$
$\varphi_-(|l|, m_1, \sigma_1^2) \cdot \varphi_+(|l|, m_2, \sigma_2^2) \cdot P_{z_3}(-z_3, m_3, \sigma_3^2) +$
$P_{z_2}(z_2, m_2, \sigma_2^2) \cdot \varphi_+(|l|, m_1, \sigma_1^2) \cdot \varphi_+(|l|, m_3, \sigma_3^2) +$
$\varphi_-(|l|, m_2, \sigma_2^2) \cdot P_{z_1}(-z_1, m_1, \sigma_1^2) \cdot \varphi_+(|l|, m_3, \sigma_3^2) +$
$\varphi_-(|l|, m_2, \sigma_2^2) \cdot \varphi_+(|l|, m_1, \sigma_1^2) \cdot P_{z_3}(-z_3, m_3, \sigma_3^2) +$
$P_{z_3}(z_3, m_3, \sigma_3^2) \cdot \varphi_+(|l|, m_1, \sigma_1^2) \cdot \varphi_+(|l|, m_2, \sigma_2^2) +$
$\varphi_-(|l|, m_3, \sigma_3^2) \cdot P_{z_1}(-z_1, m_1, \sigma_1^2) \cdot \varphi_+(|l|, m_2, \sigma_2^2) +$
$\varphi_-(|l|, m_3, \sigma_3^2) \cdot \varphi_+(|l|, m_1, \sigma_1^2) \cdot P_{z_2}(-z_2, m_2, \sigma_2^2) +$
$P_{z_1}(z_1, m_1, \sigma_1^2) \cdot \varphi_-(|l|, m_2, \sigma_2^2) \cdot \varphi_-(|l|, m_3, \sigma_3^2) +$
$\varphi_-(|l|, m_1, \sigma_1^2) \cdot P_{z_2}(z_2, m_2, \sigma_2^2) \cdot \varphi_-(|l|, m_3, \sigma_3^2) +$
$\varphi_-(|l|, m_1, \sigma_1^2) \cdot \varphi_-(|l|, m_2, \sigma_2^2) \cdot P_{z_3}(z_3, m_3, \sigma_3^2)$ The same result is found when l>0, this is omitted here.

From Equation (37), a mean value of the MaxLog approximation (also called the "minSum algorithm") can be calculated by:

[Equation 112]

$$\int_{-\infty}^{+\infty} l \cdot Q_L(l) \, dl \quad (38)$$

On the other hand, the variance can be calculated by:

[Equation 113]

$$\int_{-\infty}^{+\infty} l^2 \cdot Q_L(l) \, dl - \left\{\int_{-\infty}^{+\infty} l \cdot Q_L(l) \, dl\right\}^2 \quad (39)$$

A substitution of this into Equation (32) results in GA in a Tanner graph which is classified into categories including non-linear processing resulting from the MaxLog approximation (or also called the "minSum algorithm"). The result of searching for optimal weighting with the GA will be shown in the following example.

Example

Multivariable Polynomial

[Equation 114]

$$\begin{cases} v(r, x) \equiv \sum_{b,d} v_{b,d} \cdot r_0^{b_0} \cdot r_1^{b_1} \cdot \prod_{j=1}^{4} x_j^{d_j} = \\ 0.8 \cdot r_1 \cdot x_1^2 + 0.1 \cdot r_1 \cdot x_2^8 + 0.2 \cdot r_0 \cdot x_3^3 \cdot x_4^3 + \\ 0.1 \cdot r_0 \cdot x_3^3 \cdot x_4^3 + 0.3 \cdot r_1 \cdot x_5 \\ \mu(x) \equiv \sum_{d} \mu_d \cdot \prod_{j=1}^{n_e} x_j^{d_j} = \\ 0.8 \cdot x_1^2 \cdot x_2 \cdot x_3 + 0.3 \cdot x_4^3 \cdot x_5 \end{cases} \quad (40)$$

Figure 2:
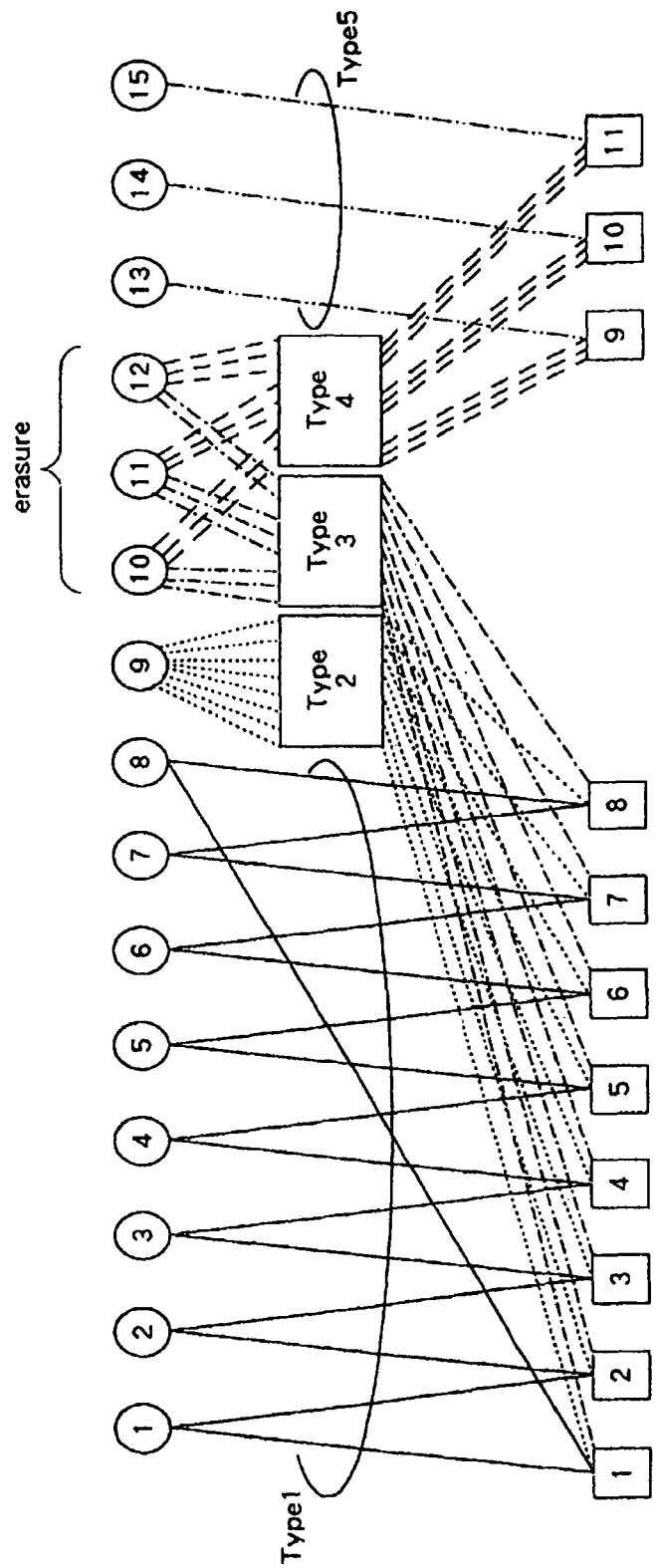
FIG. 2 A diagram showing an example of a Tanner graph (socket model) classified into categories according to the LDPC coding scheme of the present invention.

An implemented socket model is shown in FIG. 2; a test matrix in FIG. 3; and a correspondence table in FIG. 4.

This example is called "Multi-Type," where categories are provided for each Type. It is understood from the polynomial of the aforementioned Equation (40), the socket model in FIGS. 2 to 4, and the like that it is a single row weight having a row weight of four. Optimal weighting is searched by the GA in the Tanner graph in which this example is classified into categories including non-linear processing resulting from the aforementioned MaxLog approximation (or also called the "minSum algorithm"). Locations corresponding to the weighting are indicated in a block diagram as in FIG. 1. Specifically, this is configured such that each different category is independently weighted. Values which demonstrate the highest performance with the weighting at the corresponding locations on the figure are written in the left of the following table in the following manner:

TABLE 1

| Variable Node | | | | | | | |
|---|---|---|---|---|---|---|---|
| Weighting | | b | | d | | | |
| Coefficient | $v_{b,d}$ | $b_0$ | $b_1$ | $d_1$ | $d_2$ | $d_3$ | $d_4$ | $d_5$ |
| 0.98 | 0.8 | 0 | 1 | 2 | 0 | 0 | 0 | 0 |
| 0.58~0.62 | 0.1 | 0 | 1 | 0 | 8 | 0 | 0 | 0 |
| 0.58~0.62 | 0.2 | 1 | 0 | 0 | 0 | 3 | 3 | 0 |
|  | 0.1 | 1 | 0 | 0 | 0 | 2 | 3 | 0 |
| Don't care | 0.3 | 0 | 1 | 0 | 0 | 0 | 0 | 1 |
|  |  | erasure | $\sigma^2$ | Type1 | Type2 | Type3 | Type4 | Type5 |

Weighting Coefficient

As shown by this result, weighting is the highest at 0.98 in column weight 2 that has an RA structure and others are approximately in a range of 0.58 to 0.62. Presumably, this is because a node in a category having the RA structure is given highly reliable LLR from other high column weights, whereas a node in a category other than the RA structure is given a low reliable LLR from low column weights from the RA structure, so that the category with the RA structure is heavily weighted, while other categories are lightly weighted.

While it is known that a correction is made by weighting when the MaxLog approximation (or also called the "min-Sum algorithm") is used in a Tanner graph which is not classified into categories, this performs single weighting on all nodes. Alternatively, the weighting is performed with attention to the row weight rather than the column weight. On the other hand, it should be noted that the present invention performs the weighting with attention to the column weight.

For example, assuming that the weighting is performed with attention to the row weight, all row weights are four in the example described above, resulting in the same weighting value. In spite of that, improvements in characteristics are shown by changing the weight on a category-by-category basis, which is a significant difference from before, which is clarified for the first time by the present invention which attempted DE including non-linear processing in the aforementioned categorized state, and the present invention was made based on this analysis result.

Figure 5:
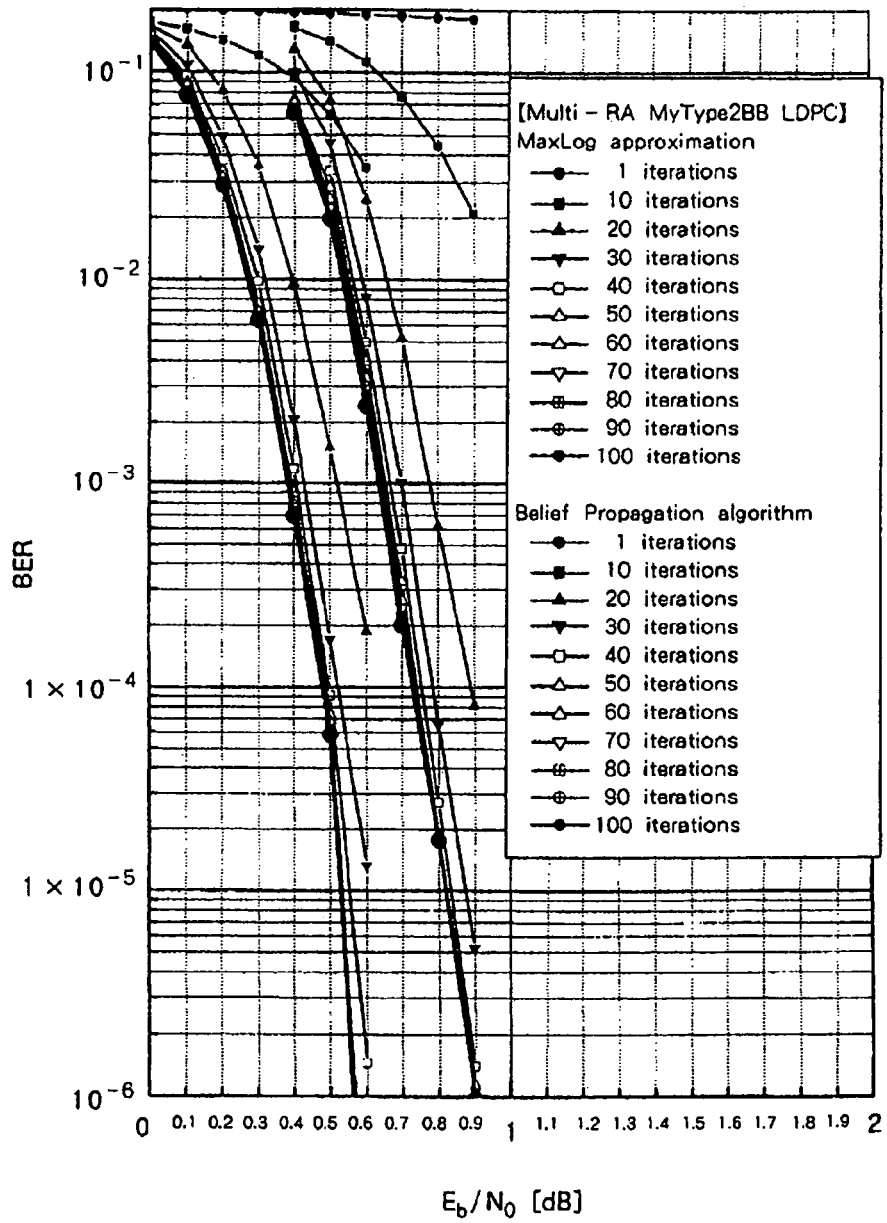
FIG. 5 A diagram showing a bit error rate characteristic by a Monte Carlo simulation, showing an effect of a scheme for weighting every category according to the LDPC coding scheme of the present invention.

The result of a Monte Carlo simulation performed with an LDPC decoder using the actual MaxLog approximation based on the foregoing result is shown in FIG. 5. In FIG. 5, the left-hand line represents a characteristic using sum-product, and the right-hand line represents a characteristic using the MaxLog approximation (or also called the "minSum algorithm"). Weighting used under this condition is as follows:

TABLE 2

| Variable Node | | | | | | | |
|---|---|---|---|---|---|---|---|
| Weighting | | b | | d | | | |
| Coefficient | $v_{b,d}$ | $b_0$ | $b_1$ | $d_1$ | $d_2$ | $d_3$ | $d_4$ | $d_5$ |
| 0.9999 | 0.8 | 0 | 1 | 2 | 0 | 0 | 0 | 0 |
| 0.58 | 0.1 | 0 | 1 | 0 | 8 | 0 | 0 | 0 |
| 0.69 | 0.2 | 1 | 0 | 0 | 0 | 3 | 3 | 0 |
|  | 0.1 | 1 | 0 | 0 | 0 | 2 | 3 | 0 |
| Don't care | 0.3 | 0 | 1 | 0 | 0 | 0 | 0 | 1 |
|  |  | erasure | $\sigma^2$ | Type1 | Type2 | Type3 | Type4 | Type5 |

Weighting Coefficient

In a final Monte Carlo simulation, the weighting at a location with a column weight of two having the RA structure is also highest with 0.9999, and others present values in a range of 0.58 to 0.69, as shown by the above result. It is understood that the same tendency is seen even though the values slightly shift due to different operating points of several objects to be optimized.

Figure 6:
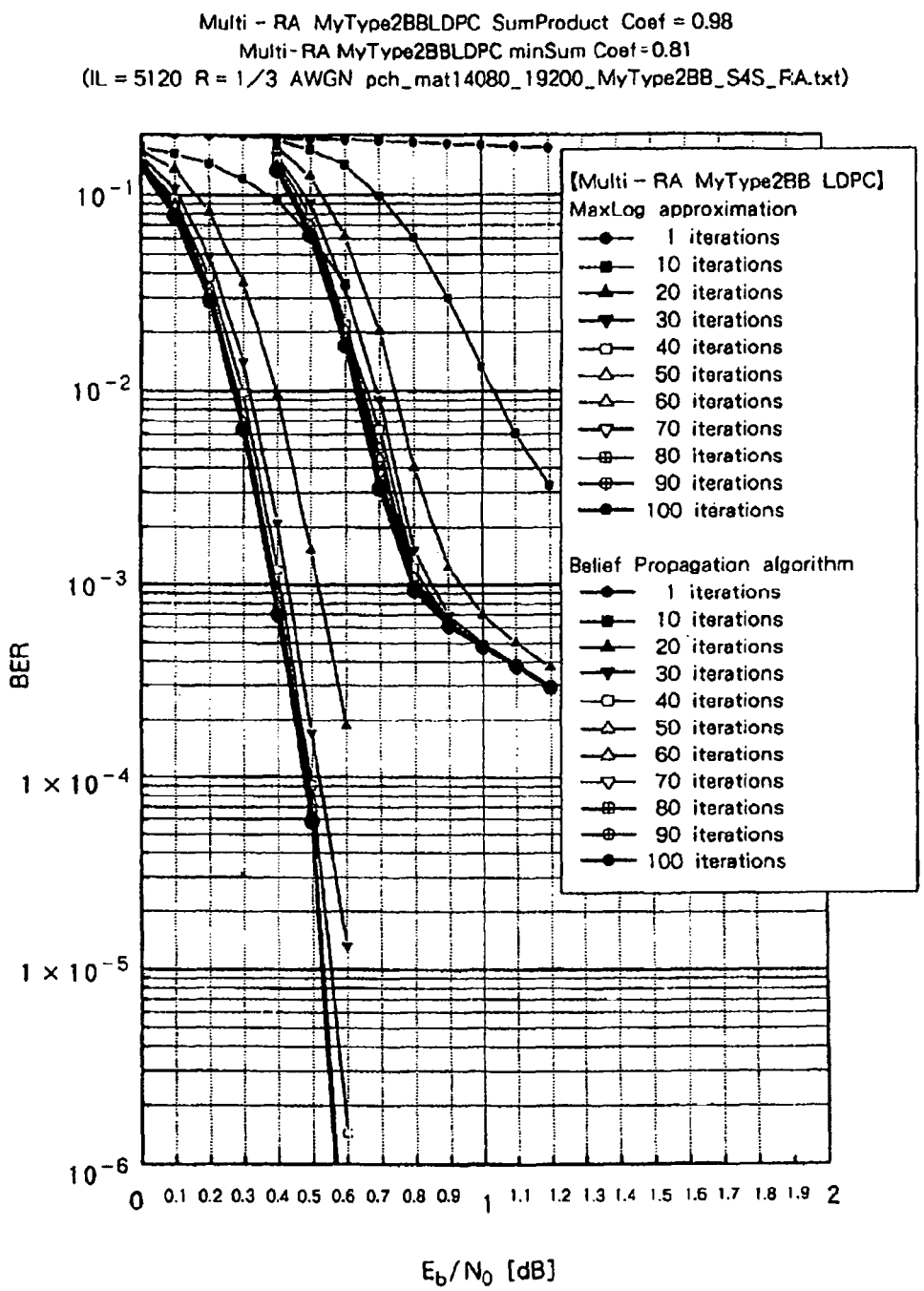
FIG. 6 A diagram showing a bit error rate characteristic by a Monte Carlo simulation using a conventional single weighting scheme.

On the other hand, FIG. 6 shows the result of optimizing weighting coefficients by a method of performing single weighting on all conventional nodes having completely the same contents in other aspects, and performing a Monte Carlo simulation. A table in which weighting coefficients are used in that event is shown below.

TABLE 3

| Variable Node | | | | | | | |
|---|---|---|---|---|---|---|---|
| Weighting | | b | | d | | | |
| Coefficient | $v_{b,d}$ | $b_0$ | $b_1$ | $d_1$ | $d_2$ | $d_3$ | $d_4$ | $d_5$ |
| 0.81 | 0.8 | 0 | 1 | 2 | 0 | 0 | 0 | 0 |
| 0.81 | 0.1 | 0 | 1 | 0 | 8 | 0 | 0 | 0 |
| 0.81 | 0.2 | 1 | 0 | 0 | 0 | 3 | 3 | 0 |
|  | 0.1 | 1 | 0 | 0 | 0 | 2 | 3 | 0 |
| 0.81 | 0.3 | 0 | 1 | 0 | 0 | 0 | 0 | 1 |
|  |  | erasure | $\sigma^2$ | Type1 | Type2 | Type3 | Type4 | Type5 |

Weighting Coefficient

As can be seen from the characteristics of FIG. 6, the right-hand line using the MaxLog approximation (or also called the "minSum algorithm") cannot be used with a single weighting coefficient alone because an error floor occurs.

The foregoing is the analysis result which underlies the present invention, and shows that the category-by-category weighting is effective for a decoder which employs the Max-Log approximation (or also called the "minSum algorithm") by a Tanner graph classified into categories.

Figure 1A:
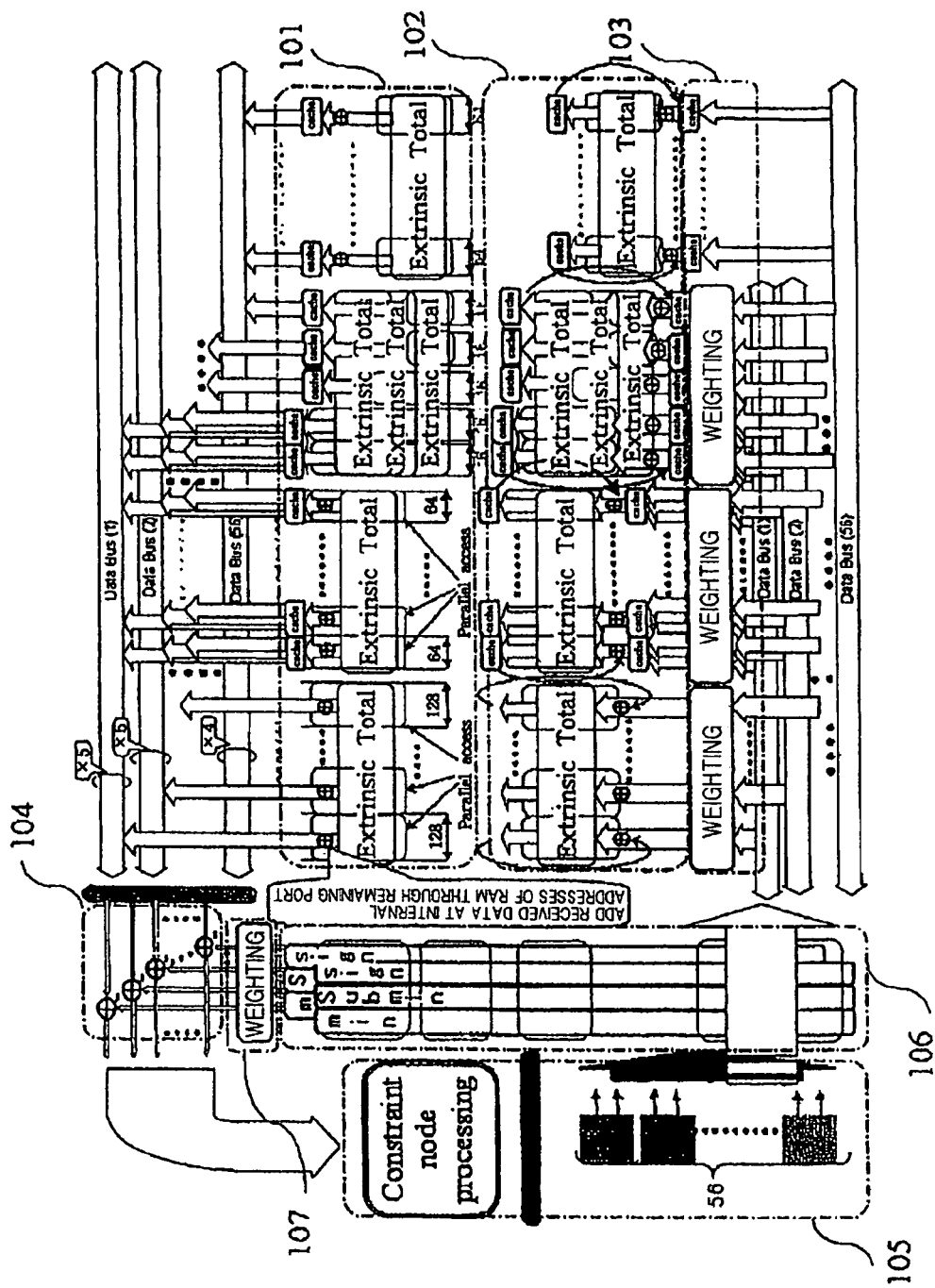
FIG. 1A A diagram illustrating a specific circuit configuration of the decoder illustrated in FIG. 1.

In the following, one embodiment of the present invention will be described with reference to FIG. 1. FIG. 1 is a block diagram illustrating the configuration of a decoder which performs weighting on a category-by-category basis using the MaxLog approximation (or also called the "minSum algorithm") by a Tanner graph classified into categories of the present invention, and FIG. 1A is a diagram illustrating a specific circuit configuration of the same.

The decoder illustrated in FIG. 1 comprises memory 100 including variable node memories 101 and 102; weighting processing units 103, 107; subtractor 104; check node processing unit 105; and check node memory 106.

Variable node memories 101 and 102 for storing variable nodes are switched to the output and input, respectively, when in use, and their interiors are divided by memory banks (not shown) in accordance with a category division in the Tanner graph. Also, an area is provided for storing received value LLR, and an output section responsible for output of variable node adds the received value LLR to a variable node and outputs the result when it outputs the variable node.

In the following description, a description is made on the assumption that variable node memories 101 and 102 are currently used for the output and input, respectively.

The variable node LLR output in the foregoing manner is weighted by weighting processing unit 103 corresponding to a category by making a selection and polarization represented by:

[Equation 116]

$$u_j = \min(|v_1|, |v_2|, \ldots, |v_n|) \cdot \prod_{i=1}^{n} \mathrm{sgn}(v_i) \quad (41)$$

for values generated from check node memory 106 which stores a first minimum, a second minimum, a polarity signal which is caused by modulo-2 addition, and the positions of the minima for the MaxLog approximation (or also called the "minSum"), i.e., variable node LLR:

$v_1 \sim v_n$ [Equation 115]

in the same row, but is output to check node processing unit 105 after an output value of weighting processing unit 107, for outputting the same weighting value as weighting processing unit 103, is subtracted by subtractor 104.

Check node processing unit 105 detects the first minimum, second minimum, the polarity signal which is caused by modulo-2 addition, and the positions of the minima for the MaxLog approximation (or also called the "minSum").

Figure 7:
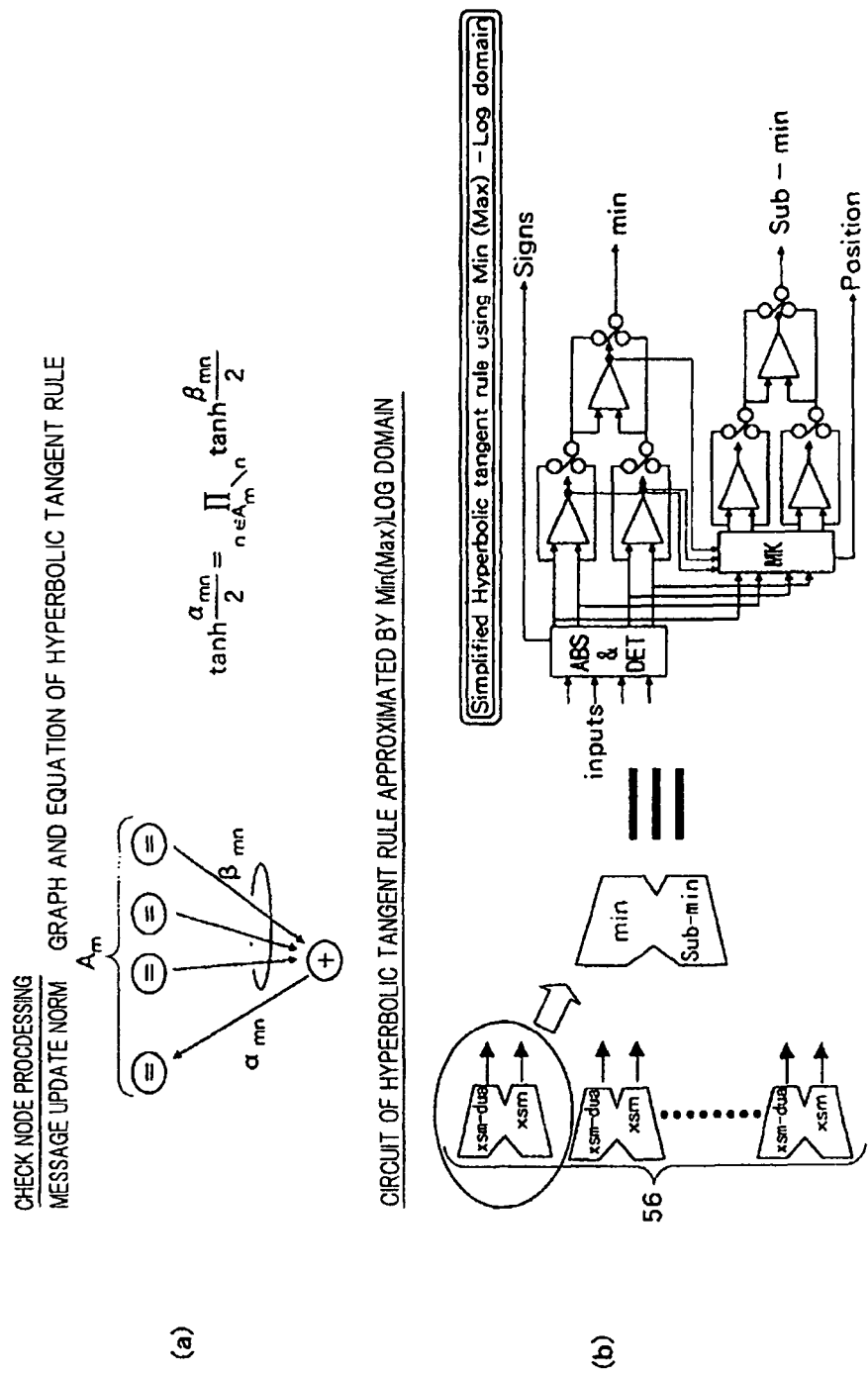
FIG. 7 A diagram illustrating a circuit which is approximated by Hyperbolic tangent rule in check node processing and a Min (Max) Log region which is simplified therefrom.

A specific circuit configuration of check node processing unit 105 is illustrated in FIG. 7. As illustrated in FIG. 7(*a*), the Hyperbolic tangent rule is realized by an approximation algorithm in a Min(Max) Log region. Here, a message update norm in check node processing is called "Hyperbolic tangent rule," and is pipelined in a parallel configuration, as illustrated in FIG. 7(*b*), so that the operation is completed in one clock on average. The circuit operation performs a minimum value detection (min) in a tree configuration, and performs a second minimum value detection (Sub-min) with the minimum value being masked. Through operations at two steps, all processing is completed equivalently in one clock because they are pipelined. It should be noted that F/Fs for pipeline are omitted in the figure because they would otherwise cause complexity.

Turning back to FIG. 1, after this check node processing is performed by check node processing unit 105, resulting values (min, Sub-min, sign which is a polarity signal which is caused by modulo-2 addition, and Position indicative of the position of the minimum value) are stored in check node memory 106.

Check node memory 106 comprises two memory units which are used as an input or an output like memory 100, and stores the values resulting from the processing of check node processing unit 105 in the input memory unit. Also, simultaneously, LLR which is the value of u in Equation (41) derived by selection and polarization that uses them is stored in variable node memory 102. In this event, weighting previously determined on a category-by-category basis is performed in weighting processing unit 103 before being stored in 102.

In this regard, while the weighting processing is performed upon storage in this block diagram, the weighting processing may be performed before the received value LLR is added in variable node memory 101 which is the output, or the weighting processing may be performed in check node processing unit 105 when outputting.

In the next cycle, the configuration is switched such that variable node memory 102 is the output, while variable node memory 101 is the input at this time. Though omitted in the figure in order to avoid complexity, weighting processing unit 103 is also adapted to act on variable node memory 101 which is the input. As well, check node memory 106 in a two-part configuration also switches between the input and output, and processing for repeatedly switching the input and output of memory alternately from one cycle to another is performed until a previously determined number of times of repetitions is reached.

Access to these memories is further divided according to memory banks within the memory banks divided on a category-by-category basis in accordance with a weight distribution in the categories, such that the processing progresses in parallel. Also, since memory access operations are performed through a caching circuit having a FIFO function taking into consideration of a scenario where parallel accesses temporarily concentrate one a timing due to the relationship of the weight distribution in each category, an increase in the number of divided memory banks, and a reduction in the number of on-chip buses are performed by an averaging effect.

Also, though not described specifically in the figure, connection information determined by a Tanner graph has a memory which preserves the positions of 1's in the test matrix in the form of an index, and LLR connection control is conducted using a small memory capacity.

Further, as is understood from FIGS. 2, 3, 4, the relationship between the category and column weights substantially corresponds in this example. In particular, while the weighting can be freely determined through categorization irrespective of the column weights, grouping based on the column weights can also be included in the category like this example.

The architecture of the decoder has been described above with reference to FIG. 1. Next, a description will be given of an encoder according to the present invention.

Test matrix H determined by a low-order profile involves a small amount of processing for decoding and is suitable for lower complexity because it is a sparse matrix. However, since it is almost certain that generation matrix G corresponding to sparse test matrix H is not a sparse matrix, encoding processing is not negligible with respect to decoding processing. However, there is known a calculation method which generates codes while making use of this sparse test matrix. Accordingly, an architecture which permits an increase in speed and is small in processing scale will be described with reference to drawings.

The encoding processing operation of the present invention comprises an offline process (Offline process) for previously performing a calculation (Pre-calculation), and a hardware-based online process (Online process). The previously performed offline process performs a matrix transformation while maintaining the sparse nature of the test matrix. On the other hand, the hardware-based online process executes the encoding processing operation at high speeds based on four matrixes A, B, T and F which are created while maintaining the sparse nature of the test matrix.

(1) Pre-Calculation (Offline Process)

The following upper triangular zero matrix H is produced by row switching and column switching of the test matrix:

[Equation 117]

-continued $$H = \begin{bmatrix} A & B & T \\ C & D & E \end{bmatrix} \quad (42)$$

where T is a lower triangular matrix having "1" at diagonal elements, and is multiplied by:

[Equation 118]

$$\begin{bmatrix} I & 0 \\ -E \cdot T^{-1} & I \end{bmatrix} \quad (43)$$

from the left results in the following matrix:

[Equation 119]

$$\begin{bmatrix} A & B & T \\ -E \cdot T^{-1} \cdot A + C & -E \cdot T^{-1} \cdot B + D & 0 \end{bmatrix} \quad (44)$$

Here, code words which are encoder outputs are represented in vector notation in the following manner:

$$x = [s\, p_1\, p_2] \quad \text{[Equation 120]}$$

In the same vector in the vector, s represents an information bit series, and $p_1$, $p_2$ represent parity bit series, respectively. Since there is a relationship as represented by:

$$H \cdot X = 0 \quad \text{[Equation 121]}$$

between code word vector X and test matrix H,

[Equation 122]

$$\begin{bmatrix} A & B & T \\ -E \cdot T^{-1} \cdot A + C & -E \cdot T^{-1} \cdot B + D & 0 \end{bmatrix} \cdot \begin{bmatrix} s^T \\ p_1^T \\ p_2^T \end{bmatrix} = 0 \quad (45)$$

The following relationship is derived from this:

[Equation 123]

$$\begin{cases} A \cdot s^T + B \cdot p_1^T + T \cdot p_2^T = 0 \Rightarrow \\ T \cdot p_2^T = (-A \cdot s^T - B \cdot p_1^T) \\ (-E \cdot T^{-1} \cdot A + C) \cdot s^T + (-E \cdot T^{-1} \cdot B + D) \cdot p_1^T = 0 \Rightarrow \\ (-E \cdot T^{-1} \cdot B + D) \cdot p_1^T = (E \cdot T^{-1} \cdot A - C) \cdot s^T \end{cases} \quad (46)$$

(2) Hardware Encoding (Online Process)

Figure 8:
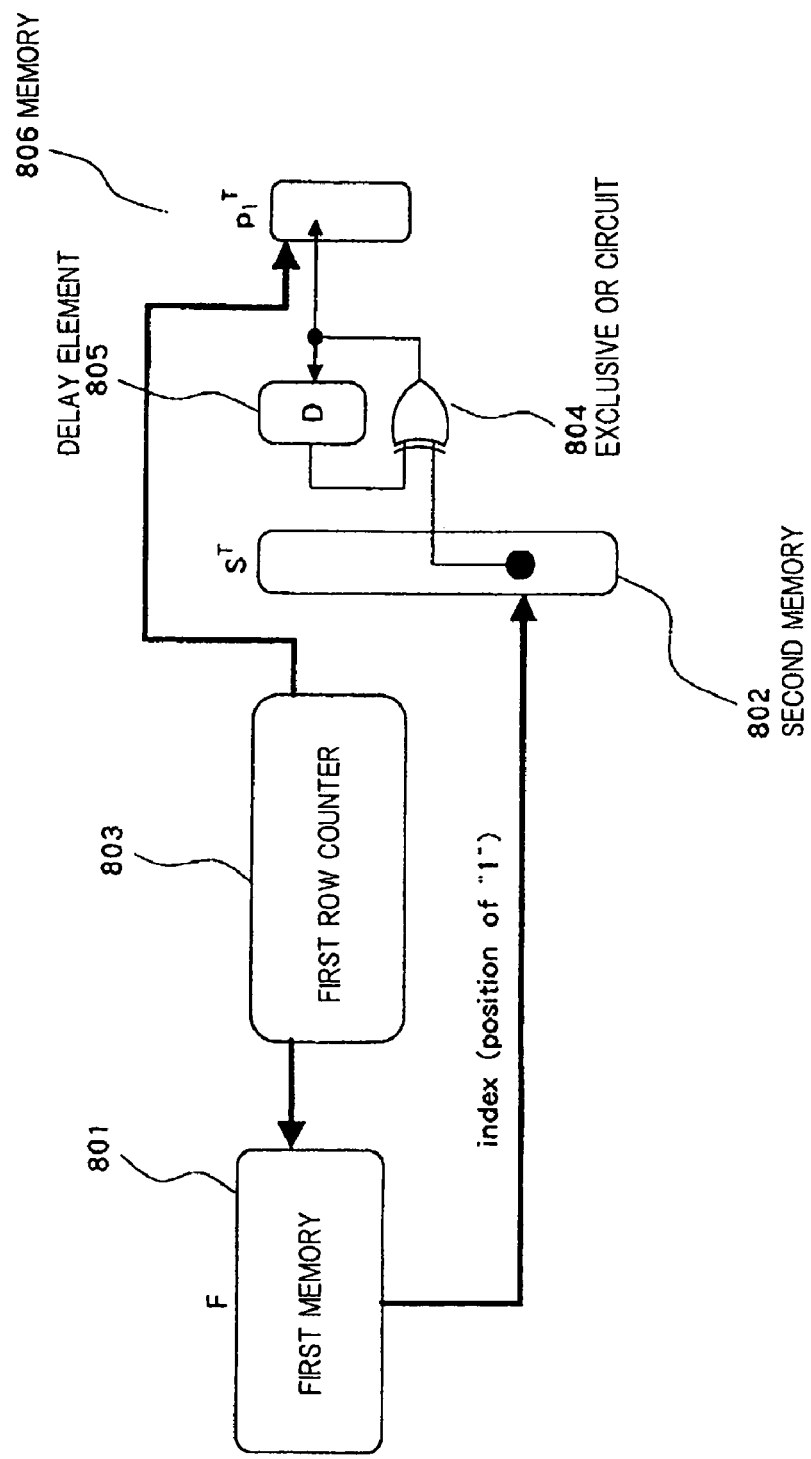
FIG. 8 A diagram illustrating a first circuit of an encoder architecture according to the LDPC coding scheme of the present invention.

Parity bit series p1, which is part of the encoder output, is generated from given information bit series s based on the aforementioned equation at high speeds.

i. s→$p_1$: from a second relationship in the aforementioned equation,

[Equation 124]

$$p_1^T = (-E \cdot T^{-1} \cdot B + D)^{-1} \cdot (E \cdot T^{-1} \cdot A - C) \cdot s^T = F \cdot s^T \text{ where;} \quad (47)$$

precalculated matrix $F = (-E \cdot T^{-1} \cdot B + D)^{-1} \cdot (E \cdot T^{-1} \cdot A - C)$ The processing in the above equation is all performed on GF(2), and the size of vector $p_1$ is very small in a portion called "gap." Accordingly, it can be implemented by a simple circuit as shown in FIG. 8. In FIG. 8, first memory 801 accumulates the position of element 1 of matrix F produced by the offline process as an index, and information bit series S is stored in second memory 802 which is addressed by first row counter 803 and is further addressed by the index output by this first memory 801. Therefore, since information bits S output by the index of 1, which is an element of matrix F, is integrated by exclusive OR circuit 804 and delay element 806 modulo 2, memory 806 for accumulating parity series p1 of the destination stores $$p_1^T = F \cdot s^T \quad \text{[Equation 125]}$$

in Equation (47).

ii. s,p1→p2: From the first relationship in the aforementioned equation (46):

[Equation 126]

$$T \cdot p_2^T = (-A \cdot s^T - B \cdot p_1^T) \quad (48)$$

where matrix T is a lower triangular matrix having "1" at diagonal elements in the following manner. Therefore,

[Equation 127]

$$\begin{bmatrix} 1 & & & 0 \\ T_{21} & 1 & & \\ \vdots & \vdots & 1 & \\ T_{n1} & T_{n2} & \ldots & 1 \end{bmatrix} \cdot \begin{bmatrix} p_1 \\ p_2 \\ \vdots \\ p_n \end{bmatrix} = \begin{bmatrix} a_1 \\ a_2 \\ \vdots \\ a_n \end{bmatrix} \quad p_2^T \quad -As^T - Bp_1^T \quad (49)$$

The following relationship is derived from this:

[Equation 128]

$$\begin{cases} p_1 = a_1 \\ p_2 = a_2 \oplus T_{21} \cdot p_1 \\ p_3 = a_3 \oplus T_{31} \cdot p_1 \oplus T_{32} \cdot p_2 \\ \vdots \\ p_n = a_n \oplus T_{n1} \cdot p_1 \oplus T_{n2} \cdot p_2 \oplus \ldots \oplus T_{nn-1} \cdot p_{n-1} \end{cases} \quad (50)$$

The processing in the above equation is all performed on GF(2), and matrix T is a lower triangular matrix and also a sparse matrix. In addition, since both A and B are sparse matrixes, they can be implemented by a simple circuit as illustrated in FIG. 9.

Figure 9:
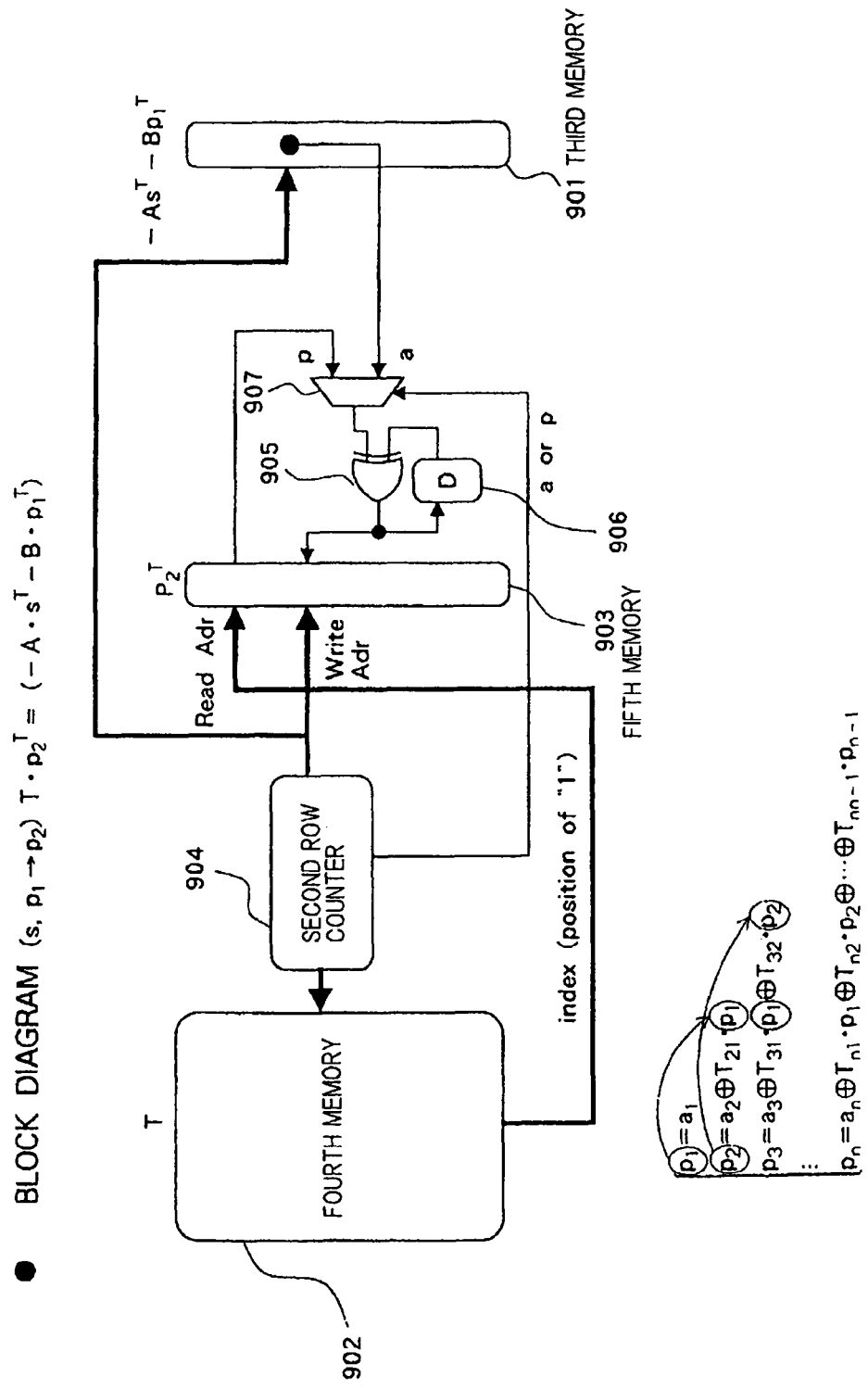
FIG. 9 A diagram illustrating a second circuit of the encoder architecture according to the LDPC coding scheme of the present invention.

In FIG. 9, third memory 901 stores the sum of a product of parity series p1 resulting from the online process by Equation (47) and matrix B resulting from the aforementioned offline process and a product of the aforementioned information bit series S and matrix A resulting from the offline process:

$$(-A \cdot s^T - B \cdot p_1^T) \quad \text{[Equation 129]}$$

and fourth memory 902 accumulates positions of elements "1" in matrix T resulting from the offline process as indexes.

Fifth memory 903 is a memory which stores second parity series p2, and uses an index output by fourth memory 902 addressed by second row counter 904 as a read address, and selector 907 is controlled by second row counter 904 such that the output of fifth memory 903 and the output of third memory 901 which stores:

$$(-A \cdot s^T - B \cdot p_1^{\ T}) \quad \text{[Equation 130]}$$

take an exclusive OR only at the first time, and subsequently, selector 907 switches to second parity series p2, thereby causing exclusive OR circuit 905 and delay element 906 to execute the processing of Equation (50). In this regard, the hardware-based processing of:

$$(-A \cdot s^T - B \cdot p_1^{\ T}) \quad \text{[Equation 131]}$$

is a normal design matter, so that a description thereon is omitted here.

The encoder of the present invention is configured by the foregoing offline process and the hardware-based online process illustrated in FIGS. 8 and 9.

Figure 10:
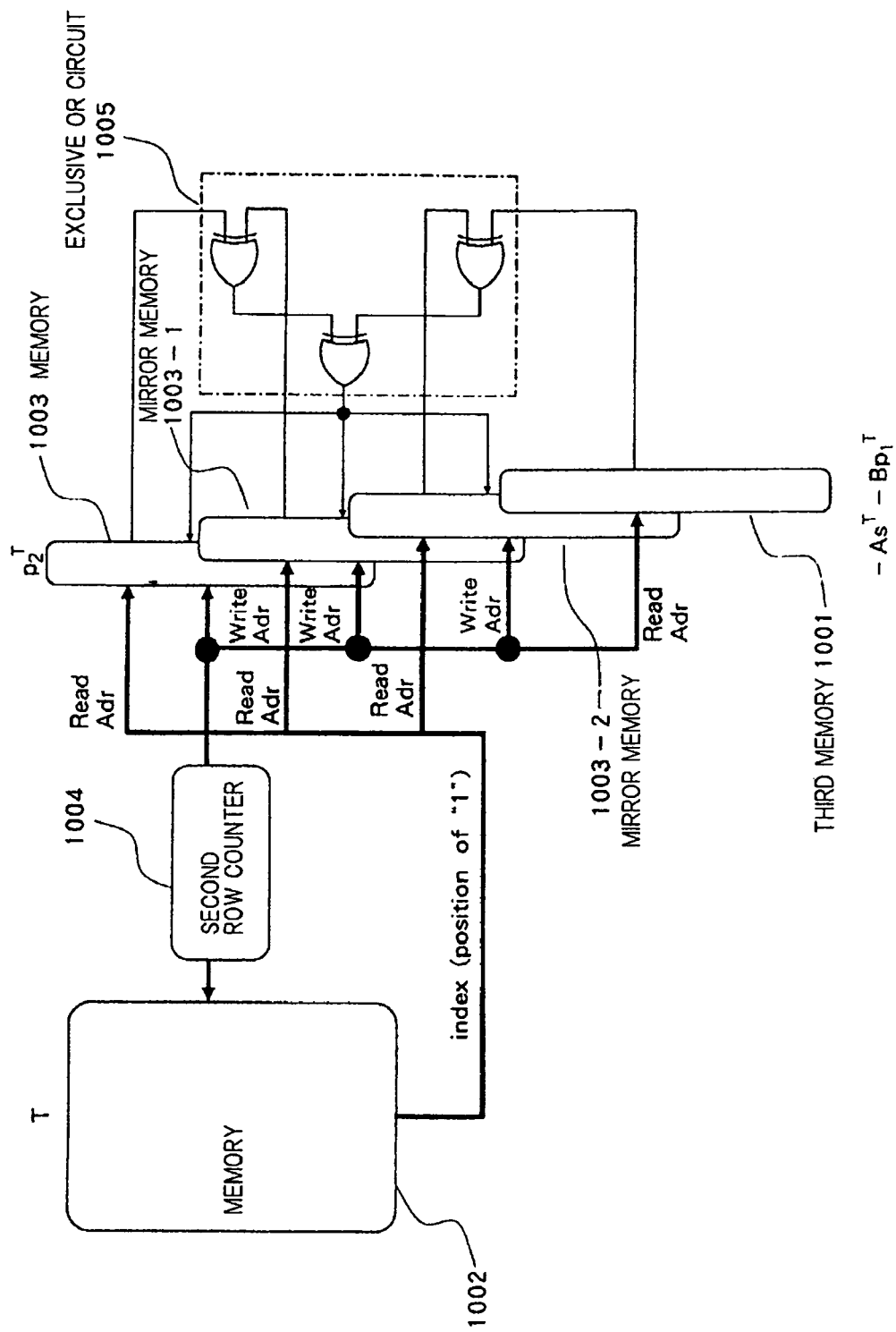
FIG. 10 A diagram illustrating a circuit which speeds up the second circuit of the encoder architecture according to the LDPC coding scheme of the present invention.

FIG. 10 is a higher speed version of the circuit of FIG. 9 which is responsible for most of loads of the encoding processing, and operates, in a manner similar to that illustrated in FIG. 9, using the positions of elements 1 of matrix T in memory 1002 addressed by second row counter 1004 as indexes.

FIG. 10 differs from the configuration illustrated in FIG. 9 only in that there are a number of indexes equal to the number of row weights, and that the indexes for the positions of all 1's within the same row are addressed in parallel to memory 1003 which stores second parity series p2. For this purpose, mirror memories 1003-1, 2 are added as memories for storing second parity series p2, and the processing of Equation (50) is performed at a time together with the output of third memory 1001 which stores:

$$(-A \cdot s^T - B \cdot p_1^{\ T}) \quad \text{[Equation 132]}$$

by exclusive OR circuit 1005, and the result is stored in memory 1003 including mirror memories 1003-1, 2, which stores second parity series p2 to accomplish fast operations.

The invention claimed is:

1. An LDPC decoder, using a Tanner graph in an LDPC coding scheme, wherein each node can be classified into a plurality of categories, said decoder thus configured is characterized by performing weighting previously determined for each of the categories for a log-likelihood ratio (hereinafter abbreviated as "LLR") subjected to a propagation in a probability propagation calculation in iterative decoding.

2. The LDPC decoder according to claim 1, configured to be characterized such that the probability propagation calculation in the iterative decoding is a MaxLog approximation (or a minSum algorithm) and the decoder determines a weighting value in accordance with a column weight of a test matrix belonging to each category.

3. The LDPC decoder according to claim 2, configured to be characterized by having a second minimum value detector circuit for detecting a first minimum value by a first minimum value detector circuit, masking an input corresponding to the detected first minimum value, and detecting a second minimum value when the probability propagation calculation in iterative decoding is performed by the MaxLog approximation (also called the "minSum algorithm"), and configuring the first and second minimum value circuits in a pipeline structure, thereby equivalently executing an approximation calculation in one clock.

4. The LDPC encoder according to claim 3, having a first memory for temporarily storing LLRs for variable nodes when the probability propagation calculation in the iterative decoding is performed by the MaxLog approximation (also called the "minSum algorithm"), and a second memory for check nodes for preserving the first minimum value and the second minimum value, and a polarity signal which is caused by modulo-2 addition of inputs thereof, wherein inputs to said first memory are sequentially performed by adding to a preserved value of said first memory based on a connection determined by the Tanner graph based on the first minimum value and the second minimum value, said first memory is classified into categories, the weighting previously determined for each category is performed for said first memory output, said decoder configured to be characterized by iterative decoding including adding the weighted LLR and a received value LLR, thereafter subtracting a value selected by connection information determined by the Tanner graph based on the first minimum value and the second minimum value as well as polarity signal which is caused by modulo-2 addition, which are the second memory accumulation result, and again performing the MaxLog approximation (also called the "minSum algorithm").

5. The LDPC decoder according to claim 4, configured to be characterized by performing the weighting for each category on the first memory input or on a path returning to a MaxLog approximation (also called the "minSum algorithm") output, rather than on the first memory output.

6. The LDPC decoder according to claim 4, configured to be characterized such that the connection information determined by the Tanner graph preserves the positions of 1's in the test matrix in the form of index.

7. The LDPC decoder according to claim 4, configured to be characterized by having two planes of first memory for temporarily preserving LLRs for the variable nodes, and two planes of second memory for check nodes for preserving the first minimum value and the second minimum value, and a polarity signal which is caused by modulo-2 addition of inputs thereof, wherein when one of the memories is used as an output, the other memory is used as an input, and the input and output of the memories are alternately switched from one repeated cycle to another in the iterative decoding.

8. The LDPC decoder according to claim 1, configured to be characterized by having a category of an RA structure (which is an abbreviation of a Repeat Accumulate structure and is also called a "zig-zag structure") within the plurality of categories as the Tanner graph, wherein weighting of the category having an RA structure is larger than weighting of other categories.

9. An LDPC decoder, using a Tanner graph in an LDPC coding scheme, wherein each node forming part of a graph can be classified into a plurality of groups according to a column weight of a test matrix thereof, said decoder configured to be characterized by performing the weighting determined for each of the groups for a log-likelihood ratio (hereinafter abbreviated as "LLR") subjected to propagation in a probability propagation calculation in iterative decoding.

10. An LDPC decoder, using a Tanner graph in an LDPC coding scheme, wherein each node can be classified into a plurality of categories, said decoder configured to be characterized by changing the number of divided memory banks for storing a log-likelihood ratio (LLR) subjected to a propagation in accordance with a weight distribution of a test matrix belonging to each category to enable a parallel access to the log-likelihood ratio.

11. The LDPC decoder according to claim 10, using a Tanner graph in an LDPC coding scheme, wherein each node can be classified into a plurality of categories, configured to be characterized by having a structure for changing the number of divided memory banks for storing a log-likelihood ratio (LLR) subjected to propagation in accordance with a weight distribution of a test matrix belonging to each category, and performing parallel access to the log-likelihood ratio through a caching circuit having a FIFO function.

12. An LDPC encoder configured to be characterized by having first means 1 for producing matrixes A, B, T having a relationship of an upper triangular zero matrix represented by:

$$H = \begin{bmatrix} A & B & T \\ C & D & E \end{bmatrix}$$ [Equation 1]

including lower triangular matrix T having 1's at diagonal elements by a matrix manipulation of test matrix H, further having second means for producing matrix F represented by:

$$F=(-E \cdot T^{-1} \cdot B + D)^{-1} \cdot (E \cdot T^{-1} \cdot A - C)$$ [Equation 2]

from the upper triangular zero matrix, wherein said first means and said second means are previously calculated offline processes, and have first memory for accumulating the positions of elements having 1's in resulting matrix F in the form of an index, second memory for storing information bit series S, and a first row counter, having a first circuit for producing first parity series p1 by taking an exclusive OR of the output of said second memory further addressed by an index output by said first memory addressed by said first row counter, having third memory for storing a series represented by:

$$-A \cdot s^T - B \cdot p_1^T$$ [Equation 3]

by taking a product of parity series p1 and matrix B resulting from the offline process, taking a product of information bit series S and matrix A resulting from the offline process, and taking an exclusive OR of the products, having fourth memory for accumulating the positions of elements of matrix T having 1's resulting from the offline process in the form of an index, fifth memory for storing second parity series p2, and a second row counter, and having a second circuit for taking an exclusive OR of the output of said fifth memory sequentially read and addressed further by an index output by said fourth memory addressed by said second row counter, and the output of said third memory addressed by said second row counter to produce second parity series p2, and writing said fourth memory written and addressed by said second row counter, wherein encoding processing is performed by the offline process and an online process by the second and second circuits.

13. The LDPC encoder according to claim 12, configured to be characterized in that said fifth memory for storing second parity series p2 comprises a number of mirror memories equal to the number of row weights of matrix T, said fourth memory for storing the positions of elements of matrix T having 1's as indexes being formatted to output a number of indexes equal to the number of row weights to a unit address, and these indexes are read and addressed to each mirror memory to perform exclusive OR for the row weights at a time.

14. An LDPC decoder using a Tanner graph which represents a code with a variable node and a check node, characterized by comprising:

a first variable node memory including a plurality of memory banks for storing a log-likelihood ratio subjected to a propagation classified into a plurality of categories on a category-by-category basis;

a second variable node memory including a plurality of memory banks for storing a weighting value for each of the plurality of categories on a category-by-category basis;

a weighting processing unit for determining a weighting value for each category stored in said second variable node memory in accordance with the log-likelihood ratio subjected to the propagation; and check node processing means for performing a probability propagation calculation in iterative decoding from stored contents of each category in said first variable node memory and second variable node memory, to output to said first variable node memory and to weighting processing unit, as the log-likelihood ratio subjected to the propagation.

15. The LDPC decoder according to claim 14, characterized in that the probability propagation calculation in iterative decoding in the check node processing unit is performed by a MaxLog approximation or a minSum algorithm, and a weighting value is determined in accordance with the column weights of a test matrix belonging to each category.

16. The LDPC decoder according to claim 15, characterized in that:

said check node processing means includes:

a first minimum value circuit for detecting a first minimum value by a first minimum value detector circuit; and a second minimum value detector circuit for masking an input corresponding to the first minimum value detected by said first minimum value circuit, and detecting a second minimum value, wherein said first and second minimum value circuits are configured in a pipeline structure, and execute an approximation calculation equivalently in one clock.

17. The LDPC decoder according to claim 16, characterized in that:

said check node processing means includes:

a first memory for temporarily preserving a log-likelihood ratio output to said first variable node memory classified into the plurality of categories and output to said weighting processing unit; and a second memory for check nodes for preserving the first minimum value and second minimum value, and a polarity signal which is caused by modulo-2 addition of inputs thereof;

sequentially adds an input to said first memory to a preserved value in said first memory based on a connection determined by the Tanner graph based on the first minimum value and second minimum value; and performs the weighting previously determined for each category for said first memory output, and performs iterative decoding including adding the weighted LLR and a received value LLR, thereafter subtracting a value selected by connection information determined by the Tanner graph based on the first minimum value and the second minimum value as well as the polarity signal which is caused by modulo-2 addition, which are the second memory accumulation result, and again performs the MaxLog approximation or the "minSum algorithm."

18. The LDPC decoder according to claim 17, configured to be characterized in that the connection information determined by the Tanner graph preserves the positions of 1's in the test matrix in the form of an index.

19. The LDPC decoder according to claim 16, characterized in that:

said check node processing means includes:

a first memory for temporarily preserving a log-likelihood ratio output to said first variable node memory classified into the plurality of categories and output to said weighting processing unit; and a second memory for check nodes for preserving the first minimum value and second minimum value, and a polarity signal which is caused by modulo-2 addition of inputs thereof;

sequentially adds an input to said first memory to a preserved value in said first memory based on a connection determined by the Tanner graph based on the first minimum value and second minimum value; and performs the weighting previously determined for each category for said first memory input or a path returned to a MaxLog approximation or minSum algorithm output, and performs iterative decoding including adding the weighted LLR and a received value LLR, thereafter subtracting a value selected by connection information determined by the Tanner graph based on the first minimum value and the second minimum value as well as polarity signal which is caused by modulo-2 addition, which are the second memory accumulation result, and again performs the MaxLog approximation or the "min-Sum algorithm."

20. The LDPC decoder according to claim 17, characterized in that said first variable node memory and said second variable node memory, and said first memory and second memory are such that when either one is used as an output, the other one is used as an input, and the input and output are alternately switched from one repeated cycle to another in the iterative decoding.

21. The LDPC decoder according to claim 14, characterized by having a category of an RA structure within the plurality of categories, where weighting for the category of an RA structure is larger than weighting for other categories.

* * * * *